US008648546B2

(12) United States Patent
Van De Ven et al.

(10) Patent No.: US 8,648,546 B2
(45) Date of Patent: Feb. 11, 2014

(54) HIGH EFFICIENCY LIGHTING DEVICE INCLUDING ONE OR MORE SATURATED LIGHT EMITTERS, AND METHOD OF LIGHTING

(75) Inventors: Antony Paul Van De Ven, Sai Kung (HK); Gerald H. Negley, Durham, NC (US)

(73) Assignee: Cree, Inc., Durham, NC (US)

( * ) Notice: Subject to any disclaimer, the term of this patent is extended or adjusted under 35 U.S.C. 154(b) by 1000 days.

(21) Appl. No.: 12/541,215

(22) Filed: Aug. 14, 2009

(65) Prior Publication Data

US 2011/0037409 A1    Feb. 17, 2011

(51) Int. Cl.
*H05B 37/02* (2006.01)
*F21V 9/00* (2006.01)

(52) U.S. Cl.
USPC ........... 315/294; 315/149; 315/150; 315/152; 315/192; 362/227; 362/231; 362/234; 362/257; 362/249.02

(58) Field of Classification Search
USPC .......... 315/149, 150, 152, 192, 294; 362/227, 362/231, 232, 234, 257, 611, 612, 249.02
See application file for complete search history.

(56) References Cited

U.S. PATENT DOCUMENTS

| | | | |
|---|---|---|---|
| 4,918,487 A | 4/1990 | Coulter, Jr. | |
| 5,384,519 A | 1/1995 | Gotoh | |
| 5,631,190 A | 5/1997 | Negley | |
| 5,803,579 A | 9/1998 | Turnbull et al. | |
| 5,912,477 A | 6/1999 | Negley | |
| 6,132,072 A | 10/2000 | Turnbull et al. | |
| 6,153,971 A | 11/2000 | Shimizu et al. | |
| 6,212,213 B1 | 4/2001 | Weber et al. | |
| 6,234,648 B1 | 5/2001 | Borner et al. | |
| 6,513,949 B1 | 2/2003 | Marshall et al. | |
| 6,538,371 B1 | 3/2003 | Duggal et al. | |

(Continued)

FOREIGN PATENT DOCUMENTS

| | | |
|---|---|---|
| EP | 1 160 883 | 12/2001 |
| JP | 10-163535 | 6/1998 |

(Continued)

OTHER PUBLICATIONS

Van de Ven et al., "Warm White Illumination with High CRI and High Efficacy by Combining 455 nm Excited Yellowish Phosphor LEDs and Red AlInGaP LEDs", First International Conference on White LEDs and Solid State Lighting, dated Nov. 2007.

(Continued)

*Primary Examiner* — Douglas W Owens
*Assistant Examiner* — Thai Pham
(74) *Attorney, Agent, or Firm* — Burr & Brown, PLLC

(57) ABSTRACT

A solid state lighting device comprising at least one first light emitter that emits non-saturated non-white light of a first color point, at least one second light emitter that emits saturated non-white light, and a controller configured to control a ratio of light emitted by the first emitter(s) and by the second light emitter(s) to provide non-white light of a second color point. Also, a solid state lighting device comprising at least one first light emitter that emits light within a first area or a second area on a Chromaticity Diagram, and at least one second light emitter, wherein output light is non-white and has a second color point. Also, methods of providing non-white light.

29 Claims, 19 Drawing Sheets

(56) References Cited

U.S. PATENT DOCUMENTS

| | | |
|---|---|---|
| 6,550,949 B1 | 4/2003 | Bauer et al. |
| 6,552,495 B1 | 4/2003 | Chang |
| 6,577,073 B2 | 6/2003 | Shimizu et al. |
| 6,692,136 B2 | 2/2004 | Marshall et al. |
| 6,784,463 B2 | 8/2004 | Camras et al. |
| 6,817,735 B2 | 11/2004 | Shimizu et al. |
| 6,841,804 B1 | 1/2005 | Lung-Chien et al. |
| 6,914,267 B2 | 7/2005 | Fukasawa et al. |
| 6,936,857 B2 | 8/2005 | Doxsee et al. |
| 7,005,679 B2 | 2/2006 | Tarsa et al. |
| 7,008,078 B2 | 3/2006 | Shimizu et al. |
| 7,014,336 B1 | 3/2006 | Ducharme et al. |
| 7,066,623 B2 | 6/2006 | Lee et al. |
| 7,095,056 B2 | 8/2006 | Vitta |
| 7,144,121 B2 | 12/2006 | Minano et al. |
| 7,213,940 B1 * | 5/2007 | Van De Ven et al. ......... 362/231 |
| 7,354,172 B2 * | 4/2008 | Chemel et al. ................ 362/231 |
| 7,358,954 B2 | 4/2008 | Negley |
| 7,614,759 B2 | 11/2009 | Negley |
| 7,718,991 B2 | 5/2010 | Negley |
| 7,722,220 B2 | 5/2010 | Van de Ven |
| 7,744,243 B2 | 6/2010 | Van de Ven et al. |
| 7,768,192 B2 | 8/2010 | Van de Ven et al. |
| 2002/0070681 A1 | 6/2002 | Shimizu et al. |
| 2003/0030063 A1 | 2/2003 | Sosniak et al. |
| 2003/0067773 A1 | 4/2003 | Marshall et al. |
| 2003/0146411 A1 | 8/2003 | Srivastava et al. |
| 2004/0105261 A1 | 6/2004 | Ducharme et al. |
| 2004/0179366 A1 | 9/2004 | Takeda et al. |
| 2004/0217364 A1 | 11/2004 | Tarsa et al. |
| 2005/0082974 A1 | 4/2005 | Fukasawa et al. |
| 2005/0276053 A1 | 12/2005 | Nortrup et al. |
| 2006/0012989 A1 | 1/2006 | Lee et al. |
| 2006/0049782 A1 * | 3/2006 | Vornsand et al. ............ 315/312 |
| 2006/0071613 A1 | 4/2006 | Lovato et al. |
| 2006/0105482 A1 | 5/2006 | Alferink et al. |
| 2006/0180818 A1 | 8/2006 | Nagai et al. |
| 2006/0237636 A1 * | 10/2006 | Lyons et al. .................. 250/228 |
| 2007/0001188 A1 | 1/2007 | Lee |
| 2007/0137074 A1 | 6/2007 | Van de Ven |
| 2007/0139920 A1 | 6/2007 | Van de Ven |
| 2007/0139923 A1 | 6/2007 | Negley |
| 2007/0170447 A1 | 7/2007 | Negley |
| 2007/0171145 A1 | 7/2007 | Coleman |
| 2007/0236911 A1 | 10/2007 | Negley |
| 2007/0263393 A1 | 11/2007 | Van de Ven |
| 2007/0267983 A1 | 11/2007 | Van de Ven |
| 2007/0274063 A1 | 11/2007 | Negley |
| 2007/0274080 A1 | 11/2007 | Negley |
| 2007/0278503 A1 | 12/2007 | Van de Ven |
| 2007/0278934 A1 | 12/2007 | Van de Ven |
| 2007/0278974 A1 | 12/2007 | Van de Ven |
| 2007/0279440 A1 | 12/2007 | Negley |
| 2007/0279903 A1 | 12/2007 | Negley |
| 2007/0280624 A1 | 12/2007 | Negley |
| 2008/0068859 A1 * | 3/2008 | Ng et al. ....................... 362/612 |
| 2008/0084685 A1 | 4/2008 | Van de Ven |
| 2008/0084700 A1 | 4/2008 | Van de Ven |
| 2008/0084701 A1 | 4/2008 | Van de Ven |
| 2008/0088248 A1 | 4/2008 | Myers |
| 2008/0089053 A1 | 4/2008 | Negley |
| 2008/0106895 A1 * | 5/2008 | Van De Ven et al. ......... 362/231 |
| 2008/0106907 A1 | 5/2008 | Trott |
| 2008/0112168 A1 | 5/2008 | Pickard |
| 2008/0112170 A1 | 5/2008 | Trott |
| 2008/0112183 A1 | 5/2008 | Negley |
| 2008/0130285 A1 * | 6/2008 | Negley et al. ................. 362/257 |
| 2008/0130298 A1 | 6/2008 | Negley |
| 2008/0136313 A1 | 6/2008 | Van de Ven |
| 2008/0136334 A1 | 6/2008 | Robinson et al. |
| 2008/0137347 A1 | 6/2008 | Trott |
| 2008/0259589 A1 | 10/2008 | Van de Ven |
| 2008/0278928 A1 | 11/2008 | Van de Ven |
| 2008/0278940 A1 | 11/2008 | Van de Ven |
| 2008/0278950 A1 | 11/2008 | Pickard |
| 2008/0278952 A1 | 11/2008 | Trott |
| 2008/0278957 A1 | 11/2008 | Pickard |
| 2008/0304260 A1 | 12/2008 | Van de Ven |
| 2008/0304261 A1 | 12/2008 | Van de Ven |
| 2008/0304269 A1 | 12/2008 | Pickard |
| 2008/0309255 A1 | 12/2008 | Myers |
| 2008/0310154 A1 | 12/2008 | Van de Ven |
| 2009/0108269 A1 | 4/2009 | Negley |
| 2009/0160363 A1 | 6/2009 | Negley |
| 2009/0184616 A1 | 7/2009 | Van de Ven |
| 2009/0184666 A1 | 7/2009 | Myers |
| 2010/0102199 A1 | 4/2010 | Negley |
| 2010/0102697 A1 | 4/2010 | Van de Ven |
| 2010/0103678 A1 | 4/2010 | Van de Ven |
| 2010/0165618 A1 | 7/2010 | Vissenberg et al. |

FOREIGN PATENT DOCUMENTS

| | | |
|---|---|---|
| JP | 2003-515956 | 5/2003 |
| JP | 2003-529889 | 10/2003 |
| JP | 2004-080046 | 3/2004 |
| JP | 2004-103443 | 4/2004 |
| JP | 2004-356116 | 12/2004 |
| JP | 2005-142311 | 6/2005 |
| WO | 2005/013365 | 2/2005 |
| WO | 2005/124877 | 12/2005 |
| WO | 2006/028312 | 3/2006 |
| WO | 2007/075815 | 7/2007 |
| WO | 2008/152561 | 12/2008 |

OTHER PUBLICATIONS

Cree® XLamp® 7090 XR-E Series LED Binning and Labeling, copyright @ 2006.

* cited by examiner

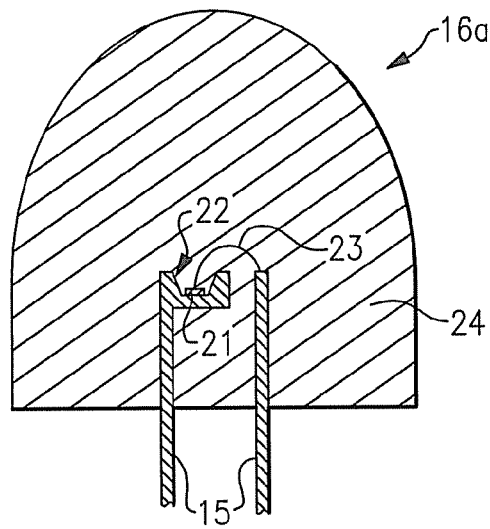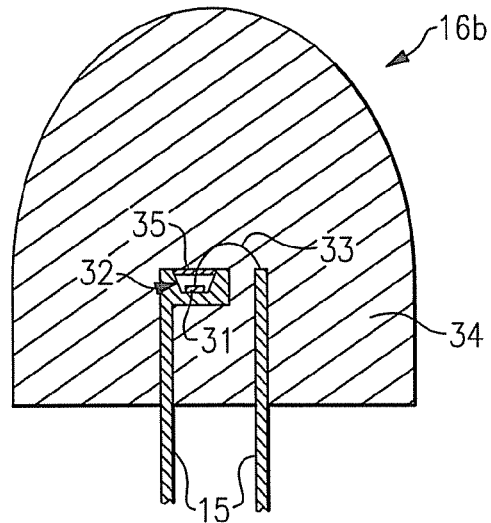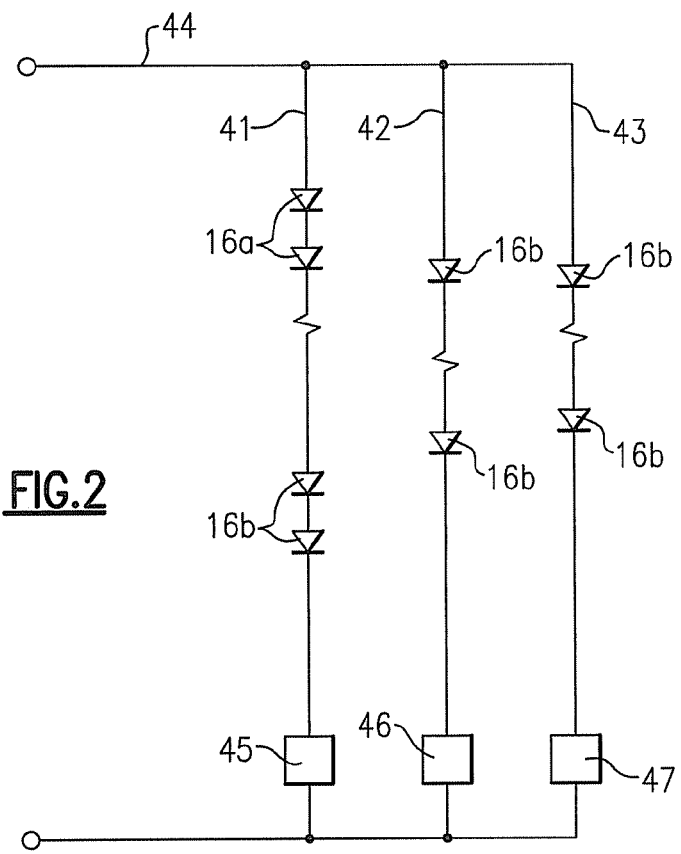

GOAL: INCREASE I-LED AS TEMPERATURE
INCREASES TO COMPENSATE FOR REDUCED
LIGHT OUTPUT OF LEDS WITH INCREASING
TEMPERATURE

HIGH EFFICIENCY LIGHTING DEVICE INCLUDING ONE OR MORE SATURATED LIGHT EMITTERS, AND METHOD OF LIGHTING

FIELD OF THE INVENTIVE SUBJECT MATTER

The present inventive subject matter relates to a lighting device, in particular, a device which includes one or more saturated light emitters in addition to one or more other light sources. The present inventive subject matter is also directed to lighting methods.

BACKGROUND

There is an ongoing effort to develop systems that are more energy-efficient. A large proportion (some estimates are as high as twenty-five percent) of the electricity generated in the United States each year goes to lighting, a large portion of which is general illumination (e.g., downlights, flood lights, spotlights and other general residential or commercial illumination products). Accordingly, there is an ongoing need to provide lighting which is more energy-efficient.

Solid state light emitters (e.g., light emitting diodes) are receiving much attention due to their energy efficiency. It is well known that incandescent light bulbs are very energy-inefficient light sources—about ninety percent of the electricity they consume is released as heat rather than light. Fluorescent light bulbs are more efficient than incandescent light bulbs (by a factor of about 10) but are still less efficient than solid state light emitters, such as light emitting diodes.

The most common type of general illumination is white light (or near white light), i.e., light that is close to the blackbody locus, e.g., within about 10 MacAdam ellipses of the blackbody locus on a 1931 CIE Chromaticity Diagram. Light with such proximity to the blackbody locus is referred to as "white" light in terms of its illumination, even though some light that is within 10 MacAdam ellipses of the blackbody locus is tinted to some degree, e.g., light from incandescent bulbs is called "white" even though it sometimes has a golden or reddish tint; also, if the light having a correlated color temperature of 1500 K or less is excluded, the very red light along the blackbody locus is excluded. The 1931 CIE Chromaticity Diagram (an international standard for primary colors established in 1931), and the 1976 CIE Chromaticity Diagram (similar to the 1931 Diagram but modified such that similar distances on the Diagram represent similar perceived differences in color) provide useful references for defining colors as weighted sums of different hues.

Because light that is perceived as white is necessarily a blend of light of two or more colors (or wavelengths), no single light emitting diode junction has been developed that can produce white light. "White" solid state light emitting lamps have been produced by providing devices that mix different colors of light, e.g., by using light emitting diodes that emit light of differing respective colors and/or by converting some or all of the light emitted from the light emitting diodes using luminescent material. For example, as is well known, some lamps use red, green and blue light emitting diodes, and other lamps use (1) one or more light emitting diodes that generate blue light and (2) luminescent material (e.g., one or more phosphor materials) that emits yellow light in response to excitation by light emitted by the light emitting diode, whereby the blue light and the yellow light, when mixed, produce light that is perceived as white light. While there is a need for more efficient white lighting, there is in general a need for more efficient lighting in all hues.

Color reproduction is typically measured using the Color Rendering Index (CRI Ra). CRI Ra is a modified average of the relative measurements of how the color rendition of an illumination system compares to that of a reference radiator when illuminating eight reference colors, i.e., it is a relative measure of the shift in surface color of an object when lit by a particular lamp. The CRI Ra equals 100 if the color coordinates of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80). Certain types of specialized lighting have very low CRI (e.g., mercury vapor or sodium lamps have Ra as low as about 40 or even lower). Sodium lights are used, e.g., to light highways—driver response time, however, significantly decreases with lower CRI Ra values (for any given brightness, legibility decreases with lower CRI Ra).

Representative examples of the use of solid state light emitters to provide a lighting device that provides excellent energy efficiency and excellent duration of service at a reasonable cost are described in U.S. Pat. No. 7,213,940, issued on May 8, 2007. U.S. Pat. No. 7,213,940 discloses lighting devices that comprise:

a first group of solid state light emitters which, if illuminated, would emit light having a dominant wavelength in the range of from 430 nm to 480 nm;

a first group of lumiphors (that comprise luminescent material) which, if excited, would emit light having a dominant emission wavelength in the range of from about 555 nm to about 585 nm; and a second group of solid state light emitters which, if illuminated, would emit light having a dominant emission wavelength in the range of from 600 nm to 630 nm;

wherein if current is supplied:

a combination of (1) light exiting the lighting device which was emitted by the first group of solid state light emitters, (2) light exiting the lighting device which was emitted by the first group of lumiphors, and (3) light exiting the lighting device which was emitted by the second group of solid state light emitters would, in an absence of any additional light, produce a mixture of light having x, y coordinates on a 1931 CIE Chromaticity Diagram which define a point which is within ten MacAdam ellipses of at least one point on the blackbody locus on a 1931 CIE Chromaticity Diagram, and a combination of (1) light exiting the lighting device which was emitted by the first group of solid state light emitters, and (2) light exiting the lighting device which was emitted by the first group of lumiphors would, in an absence of any additional light, produce a sub-mixture of light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

BRIEF SUMMARY OF THE INVENTIVE SUBJECT MATTER

In accordance with the present inventive subject matter, the inventors recognized that lighting devices that output non-white light can be provided by using (1) one or more light sources that emit light having x, y color coordinates which define a point which is within a first area on a 1931 CIE Chromaticity Diagram or a second area on a 1931 CIE Chromaticity Diagram, the first area being enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.29, 0.36, the second point having x, y coordinates of 0.32, 0.35, the third point having x, y coordinates of 0.41, 0.43, the fourth point having x, y coordinates of 0.44, 0.49, and the fifth point having x, y coordinates of 0.38, 0.53 (in the 1976 CIE Chromaticity Diagram, the first point has u', v' coordinates of 0.17, 0.48, the second point has u', v' coordinates of 0.20, 0.48, the third point has u', v' coordinates of 0.22, 0.53, the fourth point has u', v' coordinates of 0.22, 0.55, and the fifth point has u', v' coordinates of 0.18, 0.55) (or, the first point has x, y coordinates of 0.32, 0.40, the second point has x, y coordinates of 0.36, 0.48, the third point has x, y coordinates of 0.43, 0.45, the fourth point has x, y coordinates of 0.42, 0.42, and the fifth point has x, y coordinates of 0.36, 0.38), the second area being enclosed by sixth, seventh, eighth and ninth line segments, the sixth line segment connecting a sixth point to a seventh point, the seventh line segment connecting the seventh point to an eighth point, the eighth line segment connecting the eighth point to a ninth point, and the ninth line segment connecting the ninth point to the sixth point, the sixth point having x, y coordinates of 0.57, 0.35, the seventh point having x, y coordinates of 0.62, 0.32, the eighth point having x, y coordinates of 0.37, 0.16, and the ninth point having x, y coordinates of 0.40, 0.23 (in the 1976 CIE Chromaticity Diagram, the sixth point has u', v' coordinates of 0.376, 0.520, the seventh point has u', v' coordinates of 0.443, 0.514, the eighth point has u', v' coordinates of 0.354, 0.344, and the ninth point has u', v' coordinates of 0.323, 0.417), to provide a significant amount of lumens for the lighting device, and using (2) one or more light emitters that emit saturated light to pull the color point of the output light to a desired non-white color point.

In accordance with some embodiments of the present inventive subject matter, there are provided devices that comprise at least one first light emitter that emits non-saturated non-white light of a first color point.

The expression "non-white", as used herein, means light that has a color point that is spaced by at least a unit distance of 0.01 (in the scale of u' v' coordinates) from the nearest point on the blackbody locus in a 1976 CIE Chromaticity Diagram (or at least 10 MacAdams ellipses).

The expression "color point", as used herein with respect to light means a point defined by x, y color coordinates on a 1931 CIE Chromaticity Diagram designating a color hue that matches the color hue of the light.

In accordance with some embodiments of the present inventive subject matter, there are provided devices that comprise at least one second light emitter that emits saturated non-white light.

The term "saturated", as used herein, means having a purity of at least 85%, the term "purity" having a well-known meaning to persons skilled in the art, and procedures for calculating purity being well-known to those of skill in the art.

In accordance with some embodiments of the present inventive subject matter, there are provided devices that comprise a controller configured to control a ratio of non-white light emitted by at least one first light emitter and saturated non-white light emitted by at least one second light emitter such that a combination of the non-white light and the saturated non-white light is non-saturated, non-white light of a second color point.

In accordance with some embodiments of the present inventive subject matter, there are provided methods that comprise illuminating at least one first light emitter that emits non-saturated non-white light of a first color point.

In accordance with some embodiments of the present inventive subject matter, there are provided methods that comprise illuminating at least one second light emitter that emits saturated non-white light.

In accordance with some embodiments of the present inventive subject matter, there are provided methods that comprise controlling a ratio of non-white light emitted by at least one first light emitter and saturated non-white light emitted by at least one second light emitter such that a combination of the non-white light and the saturated non-white light is non-saturated, non-white light of a second color point.

In accordance with some embodiments of the present inventive subject matter, there is provided a solid state lighting device comprising:

at least one first light emitter that emits non-saturated non-white light of a first color point;

at least one second light emitter that emits saturated non-white light; and a controller configured to control a ratio of the non-white light of the first color point emitted by the at least one first light emitter and the saturated non-white light emitted by the at least one second light emitter such that a combination of the non-white light of the first color point emitted by the at least one first light emitter and the saturated non-white light emitted by the at least one second light emitter is non-saturated, non-white light of a second color point.

In some embodiments according to the present inventive subject matter, the first color point is within one of a first area on a 1931 CIE Chromaticity Diagram and a second area on a 1931 CIE Chromaticity Diagram, the first area being enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.29, 0.36, the second point having x, y coordinates of 0.32, 0.35, the third point having x, y coordinates of 0.41, 0.43, the fourth point having x, y coordinates of 0.44, 0.49, and the fifth point having x, y coordinates of 0.38, 0.53 (or, the first point has x, y coordinates of 0.32, 0.40, the second point has x, y coordinates of 0.36, 0.48, the third point has x, y coordinates of 0.43, 0.45, the fourth point has x, y coordinates of 0.42, 0.42, and the fifth point has x, y coordinates of 0.36, 0.38), the second area being enclosed by sixth, seventh, eighth and ninth line segments, the sixth line segment connecting a sixth point to a seventh point, the seventh line segment connecting the seventh point to an eighth point, the eighth line segment connecting the eighth point to a ninth point, and the ninth line segment connecting the ninth point to the sixth point, the sixth point having x, y coordinates of 0.57, 0.35, the seventh point having x, y coordinates of 0.62, 0.32, the eighth point having x, y coordinates of 0.37, 0.16, and the ninth point having x, y coordinates of 0.40, 0.23 (in the 1976 CIE Chromaticity Diagram, the sixth point has u', v' coordinates of 0.376, 0.520, the seventh point has u', v' coordinates of 0.443, 0.514, the eighth point has u', v' coordinates of 0.354, 0.344, and the ninth point has u', v' coordinates of 0.323, 0.417).

In accordance with some embodiments of the present inventive subject matter, there is provided a solid state lighting device comprising:

at least one first light emitter that emits light which, in an absence of any additional light, has x, y color coordinates which define a point which is within one of a first area on a 1931 CIE Chromaticity Diagram and a second area on a 1931 CIE Chromaticity Diagram; and at least one second light emitter, the at least one second light emitter comprising a second solid state light emitter, the first area being enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.29, 0.36, the second point having x, y coordinates of 0.32, 0.35, the third point having x, y coordinates of 0.41, 0.43, the fourth point having x, y coordinates of 0.44, 0.49, and the fifth point having x, y coordinates of 0.38, 0.53 (or, the first point has x, y coordinates of 0.32, 0.40, the second point has x, y coordinates of 0.36, 0.48, the third point has x, y coordinates of 0.43, 0.45, the fourth point has x, y coordinates of 0.42, 0.42, and the fifth point has x, y coordinates of 0.36, 0.38), the second area being enclosed by sixth, seventh, eighth and ninth line segments, the sixth line segment connecting a sixth point to a seventh point, the seventh line segment connecting the seventh point to an eighth point, the eighth line segment connecting the eighth point to a ninth point, and the ninth line segment connecting the ninth point to the sixth point, the sixth point having x, y coordinates of 0.57, 0.35, the seventh point having x, y coordinates of 0.62, 0.32, the eighth point having x, y coordinates of 0.37, 0.16, and the ninth point having x, y coordinates of 0.40, 0.23 (in the 1976 CIE Chromaticity Diagram, the sixth point has u', v' coordinates of 0.376, 0.520, the seventh point has u', v' coordinates of 0.443, 0.514, the eighth point has u', v' coordinates of 0.354, 0.344, and the ninth point has u', v' coordinates of 0.323, 0.417), wherein:

when the at least one first light emitter and the at least one second light emitter are illuminated, output light from the lighting device has a non-white color point.

The expression "output light', as used herein means light that exits a lighting device. Accordingly, in embodiments of lighting devices that comprise one or more filter, the expression "output light" does not include light that has not yet passed through the filter and that will pass through the filter before exiting the lighting device.

In accordance with some embodiments of the present inventive subject matter, there is provided a method comprising:

illuminating at least one first light emitter that emits non-saturated non-white light of a first color point;

illuminating at least one second light emitter that emits saturated non-white light; and controlling a ratio of the non-white light of the first color point emitted by the at least one first light emitter and the saturated non-white light emitted by the at least one second light emitter such that a combination of the non-white light of the first color point emitted by the at least one first light emitter and the saturated non-white light emitted by the at least one second light emitter is non-saturated, non-white light of a second color point.

In accordance with some embodiments of the present inventive subject matter, there is provided a method comprising:

illuminating at least one first light emitter to emit light which, in an absence of any additional light, has x, y color coordinates which define a point which is within one of a first area on a 1931 CIE Chromaticity Diagram and a second area on a 1931 CIE Chromaticity Diagram; and illuminating at least one second light emitter, the at least one second light emitter comprising a second solid state light emitter, to provide output light from the lighting device, the output light having a non-white color point, the first area being enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.29, 0.36, the second point having x, y coordinates of 0.32, 0.35, the third point having x, y coordinates of 0.41, 0.43, the fourth point having x, y coordinates of 0.44, 0.49, and the fifth point having x, y coordinates of 0.38, 0.53, the second area being enclosed by sixth, seventh, eighth and ninth line segments, the sixth line segment connecting a sixth point to a seventh point, the seventh line segment connecting the seventh point to an eighth point, the eighth line segment connecting the eighth point to a ninth point, and the ninth line segment connecting the ninth point to the sixth point, the sixth point having x, y coordinates of 0.57, 0.35, the seventh point having x, y coordinates of 0.62, 0.32, the eighth point having x, y coordinates of 0.37, 0.16, and the ninth point having x, y coordinates of 0.40, 0.23 (in the 1976 CIE Chromaticity Diagram, the sixth point has u', v' coordinates of 0.376, 0.520, the seventh point has u', v' coordinates of 0.443, 0.514, the eighth point has u', v' coordinates of 0.354, 0.344, and the ninth point has u', v' coordinates of 0.323, 0.417).

In some embodiments according to the present inventive subject matter, which may include or not include any of the features described above, the first light emitter comprises a first solid state light emitter that emits light of a first peak emission wavelength and a light conversion material that is excited by light of the first peak emission wavelength to emit broad spectrum light, and the second light emitter comprises a second solid state light emitter that emits light of a second peak emission wavelength, different from the first peak emission wavelength.

The expression "broad spectrum", as used herein, means that the emission that is characterized as being "broad spectrum" covers at least 60% of the visible light spectrum with substantially continuous wavelengths and includes no peaks with full width half max of less than 15 nm.

In some embodiments according to the present inventive subject matter, which may include or not include any of the features described above, the second peak emission wavelength is near UV (e.g., having a peak wavelength of less than 400 nm, such as from about 360 nm to about 400 nm), or is in one of the ranges selected from among 400-420 nm, 420-480 nm, 480-510 nm, 510-540 nm, 540-570 nm, 570-600 nm, 600-620 nm, and 620-660 nm. Ultraviolet (UV) light is by definition non-visible and therefore unable to be defined in terms of a dominant wavelength. UV is defined by bands or peak wavelength or wavelength range. UV is defined as having a wavelength between 100 nm and 400 nm. There is crossover between the wavelengths of some visible colors such as deep purple or violet and UV. This crossover range is from about 360 nm to about 400 nm. Light in this range can be defined in terms of both dominant or peak wavelength. For clarification, any wavelength used herein to characterize illumination or excitation by near UV light, and/or any illumination or excitation within any range which encompasses any wavelength below 400 nm, will refer to its peak wavelength.

In some embodiments according to the present inventive subject matter, which may include or not include any of the features described above, the second color point is below the blackbody locus on the 1931 CIE Chromaticity Diagram.

The expression "above the blackbody locus", as used herein, means that the y coordinate value of the color point is greater than the y coordinate value of the point on the blackbody locus that has the same x coordinate value as the color point, and the expression "below the blackbody locus", as used herein, means that the y coordinate value of the color point is less than the y coordinate value of the point on the blackbody locus that has the same x coordinate value as the color point. In the case of a point that has a x coordinate value that is less than the x coordinate value of the point on the blackbody locus that has the lowest x coordinate value, the point is "above the blackbody locus" if its y coordinate value is greater than the y coordinate value of the point on the blackbody locus that has the lowest x coordinate value, and the point is "below the blackbody locus" if its y coordinate value is less than the y coordinate value of the point on the blackbody locus that has the lowest x coordinate value. In the case of a point that has an x coordinate value that is greater than the x coordinate value of the point on the blackbody locus that has the highest x coordinate value, by definition the point is "below the blackbody locus" because all points that have x coordinate values that are greater than the x coordinate value of the point on the blackbody locus that has the highest x coordinate value have y coordinate values that are lower than the y coordinate value of the point on the blackbody locus that has the highest x coordinate value.

In some embodiments according to the present inventive subject matter, which may include or not include any of the features described above, the second color point is within a third area on a 1931 CIE Chromaticity Diagram enclosed by tenth, eleventh, twelfth, thirteenth, fourteenth, fifteenth and sixteenth line segments, the tenth line segment connecting a tenth point to a eleventh point, the eleventh line segment connecting the eleventh point to a twelfth point, the twelfth line segment connecting the twelfth point to a thirteenth point, the thirteenth line segment connecting the thirteenth point to a fourteenth point, the fourteenth line segment connecting the fourteenth point to a fifteenth point, the fifteenth line segment connecting the fifteenth point to a sixteenth point, the sixteenth line segment connecting the sixteenth point to the tenth point, the tenth point having x, y coordinates of 0.490, 0.395, the eleventh point having x, y coordinates of 0.530, 0.400, the twelfth point having x, y coordinates of 0.540, 0.380, the thirteenth point having x, y coordinates of 0.545, 0.345, the fourteenth point having x, y coordinates of 0.480, 0.350, the fifteenth point having x, y coordinates of 0.420, 0.345, and the sixteenth point having x, y coordinates of 0.435, 0.375 (in the 1976 CIE Chromaticity Diagram, the tenth point has u', v' coordinates of 0.290, 0.526, the eleventh point has u', v' coordinates of 0.315, 0.534, the twelfth point has u', v' coordinates of 0.333, 0.528, the thirteenth point has u', v' coordinates of 0.360, 0.513, the fourteenth point has u', v' coordinates of 0.308, 0.505, the fifteenth point has u', v' coordinates of 0.267, 0.493, and the sixteenth point has u', v' coordinates of 0.262, 0.509).

In some embodiments according to the present inventive subject matter, which may include or not include any of the features described above, the first color point is within the first area on a 1931 CIE Chromaticity Diagram and the at least one second light emitter that emits saturated non-white light emits light having a peak emission wavelength in the range of from about 600 nm to about 660 nm.

In some embodiments according to the present inventive subject matter, which may include or not include any of the features described above, the first color point is within the second area on a 1931 CIE Chromaticity Diagram and the at least one second light emitter that emits saturated non-white light emits light having a peak emission wavelength in the range of from about 495 nm to about 575 nm.

In some embodiments according to the present inventive subject matter, which may include or not include any of the features described above, the combination of the non-white light of the first color point emitted by the at least one first light emitter and the saturated non-white light emitted by the at least one second light emitter has a CRI Ra at least 50, in some embodiments, at least 60, in some embodiments, at least 70, in some embodiments, at least 80, in some embodiments, at least 85, and in some embodiments, at least 90.

In some embodiments according to the present inventive subject matter, which may include or not include any of the features described above, the second color point is within one of a fourth area on a 1976 CIE Chromaticity Diagram, a fifth area on a 1976 CIE Chromaticity Diagram, a sixth area on a 1976 CIE Chromaticity Diagram, a seventh area on a 1976 CIE Chromaticity Diagram, an eighth area on a 1976 CIE Chromaticity Diagram, a ninth area on a 1976 CIE Chromaticity Diagram, a tenth area on a 1976 CIE Chromaticity Diagram, and an eleventh area on a 1976 CIE Chromaticity Diagram, the fourth area comprising a fourth color point having u', v' coordinates of 0.325, 0.520 (in the 1931 CIE Chromaticity Diagram, x, y coordinates of 0.520, 0.370), and all color points that are spaced therefrom by a unit distance of not more than 0.02 on the 1976 CIE Chromaticity Diagram, the fifth area comprising a fifth color point having u', v' coordinates of 0.150, 0.551 (in the 1931 CIE Chromaticity Diagram, x, y coordinates of 0.330, 0.540), and all color points that are spaced therefrom by a unit distance of not more than 0.02 on the 1976 CIE Chromaticity Diagram, the sixth area comprising a sixth color point having u', v' coordinates of 0.103, 0.499 (in the 1931 CIE Chromaticity Diagram, x, y coordinates of 0.200, 0.430), and all color points that are spaced therefrom by a unit distance of not more than 0.02 on the 1976 CIE Chromaticity Diagram, the seventh area comprising a seventh color point having u', v' coordinates of 0.103, 0.402 (in the 1931 CIE Chromaticity Diagram, x, y coordinates of 0.150, 0.260), and all color points that are spaced therefrom by a unit distance of not more than 0.02 on the 1976 CIE Chromaticity Diagram, the eighth area comprising an eighth color point having u', v' coordinates of 0.152, 0.303 (in the 1931 CIE Chromaticity Diagram, x, y coordinates of 0.170, 0.150), and all color points that are spaced therefrom by a unit distance of not more than 0.02 on the 1976 CIE Chromaticity Diagram, the ninth area comprising a ninth color point having u', v' coordinates of 0.250, 0.303 (in the 1931 CIE Chromaticity Diagram, x, y coordinates of 0.260, 0.140), and all color points that are spaced therefrom by a unit distance of not more than 0.02 on the 1976 CIE Chromaticity Diagram, the tenth area comprising a tenth color point having u', v' coordinates of 0.354, 0.344 (in the 1931 CIE Chromaticity Diagram, x, y coordinates of 0.370, 0.160), and all color points that are spaced therefrom by a unit distance of not more than 0.02 on the 1976 CIE Chromaticity Diagram, and the eleventh area comprising an eleventh color point having u', v' coordinates of 0.354, 0.450 (in the 1931 CIE Chromaticity Diagram, x, y coordinates of 0.460, 0.260), and all color points that are spaced therefrom by a unit distance of not more than 0.02 on the 1976 CIE Chromaticity Diagram.

In some embodiments according to the present inventive subject matter, which may include or not include any of the features described above, the second color point is above the blackbody locus on the 1931 CIE Chromaticity Diagram.

In some embodiments according to the present inventive subject matter, which may include or not include any of the features described above, the saturated non-white light emitted by the at least one second light emitter is of a third color point that is above the blackbody locus of the 1931 CIE Chromaticity Diagram.

In some embodiments according to the present inventive subject matter, which may include or not include any of the features described above, the second light emitter comprises a light emitting diode.

In some embodiments according to the present inventive subject matter, which may include or not include any of the features described above, the first light emitter comprises a first solid state light emitter that emits light of a first peak emission wavelength in the range of from 400 nm to 480 nm (and in some cases in the range of from 430 nm to 480 nm) (lower wavelengths being particularly suitable for providing output light having correlated color temperature less than 2500 K) and a light conversion material that is excited by light of the first peak emission wavelength to emit broad spectrum light having a dominant emission wavelength in the range of from about 555 nm to about 585 nm.

In some embodiments according to the present inventive subject matter, which may include or not include any of the features described above, the at least one first light emitter comprises a plurality of light sources that each comprise at least one light emitting diode and at least one luminescent material.

In some embodiments according to the present inventive subject matter, which may include or not include any of the features described above, the first light emitter comprises at least one packaged solid state light emitter which comprises at least a light emitting diode and at least one luminescent material.

In some embodiments according to the present inventive subject matter, which may include or not include any of the features described above, the lighting device has a wall plug efficiency of at least 10 lumens per watt, in some embodiments, at least 20 lumens per watt, in some embodiments, at least 30 lumens per watt, in some embodiments, at least 40 lumens per watt, in some embodiments, at least 50 lumens per watt, in some embodiments, at least 60 lumens per watt, in some embodiments, at least 70 lumens per watt, in some embodiments, at least 80 lumens per watt, in some embodiments, at least 90 lumens per watt, in some embodiments, at least 100 lumens per watt, and in some embodiments, at least 110 lumens per watt.

The present inventive subject matter is also directed to a light fixture that comprises at least one lighting device as described herein.

The inventive subject matter may be more fully understood with reference to the accompanying drawings and the following detailed description of the inventive subject matter.

BRIEF DESCRIPTION OF THE DRAWING FIGURES

FIG. 1 depicts a first embodiment of a lighting device in accordance with the present inventive subject matter.

FIG. 2, which is a schematic electrical diagram of a portion of the circuitry in the device depicted in FIG. 1.

FIG. 3 is a cross-sectional view of one of the supplemental LEDs 16a employed in the embodiment depicted in FIGS. 1 and 5.

FIG. 4 is a cross-sectional view of one of the light sources 16b employed in the embodiment depicted in FIGS. 1 and 5.

DETAILED DESCRIPTION OF THE INVENTIVE SUBJECT MATTER

Figure 1:
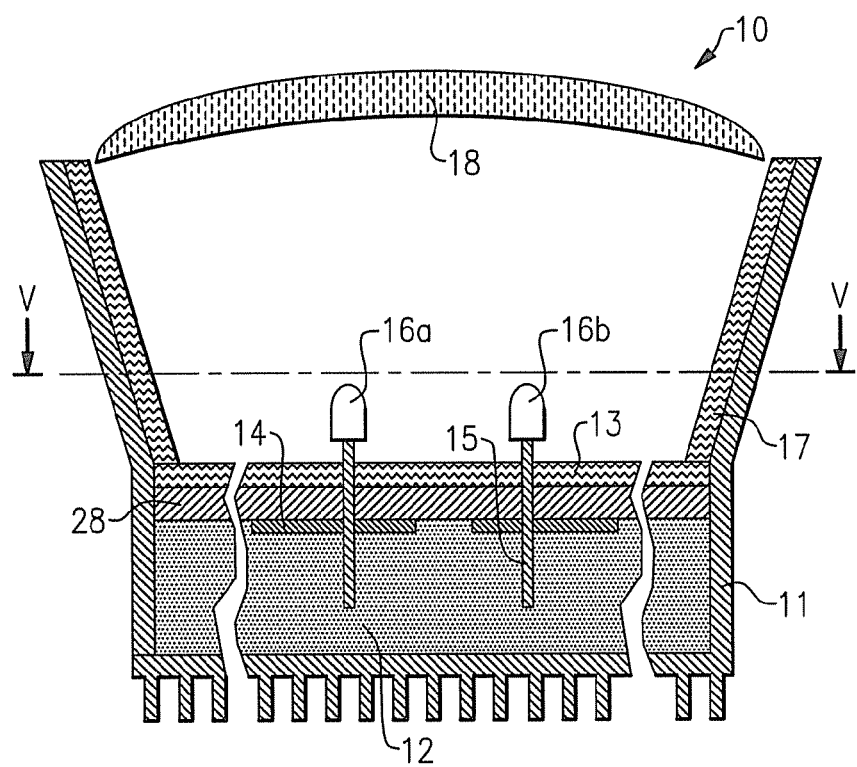

The present inventive subject matter now will be described more fully hereinafter with reference to the accompanying drawings, in which embodiments of the inventive subject matter are shown. However, this inventive subject matter should not be construed as limited to the embodiments set forth herein. Rather, these embodiments are provided so that this disclosure will be thorough and complete, and will fully convey the scope of the inventive subject matter to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

When an element such as a layer, region or substrate is referred to herein as being "on" or extending "onto" another element, it can be directly on or extend directly onto the other element or intervening elements may also be present. In contrast, when an element is referred to herein as being "directly on" or extending "directly onto" another element, there are no intervening elements present. Also, when an element is referred to herein as being "connected" or "coupled" to another element, it can be directly connected or coupled to the other element or intervening elements may be present. In contrast, when an element is referred to herein as being "directly connected" or "directly coupled" to another element, there are no intervening elements present. In addition, a statement that a first element is "on" a second element is synonymous with a statement that the second element is "on" the first element.

Although the terms "first", "second", etc. may be used herein to describe various elements, components, regions, layers, sections and/or parameters, these elements, components, regions, layers, sections and/or parameters should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive subject matter.

Relative terms, such as "lower", "bottom", "below", "upper", "top" or "above," may be used herein to describe one element's relationship to another elements as illustrated in the Figures. Such relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The expression "illumination" (or "illuminated"), as used herein when referring to a solid state light emitter, means that at least some current is being supplied to the solid state light emitter to cause the solid state light emitter to emit at least some light. The expression "illuminated" encompasses situations where the solid state light emitter emits light continuously, or intermittently at a rate such that a human eye would perceive it as emitting light continuously or intermittently, or where a plurality of solid state light emitters of the same color or different colors are emitting light intermittently and/or alternatingly (with or without overlap in "on" times) in such a way that a human eye would perceive them as emitting light continuously or intermittently (and, in some cases where different colors are emitted, as a mixture of those colors).

The expression "excited", as used herein when referring to luminescent material, means that at least some electromagnetic radiation (e.g., visible light, UV light or infrared light) is contacting the luminescent material, causing the luminescent material to emit at least some light. The expression "excited" encompasses situations where the luminescent material emits light continuously, or intermittently at a rate such that a human eye would perceive it as emitting light continuously or intermittently, or where a plurality of luminescent materials of the same color or different colors are emitting light intermittently and/or alternatingly (with or without overlap in "on" times) in such a way that a human eye would perceive them as emitting light continuously or intermittently (and, in some cases where different colors are emitted, as a mixture of those colors).

The expression "lighting device", as used herein, is not limited, except that it indicates that the device is capable of emitting light. That is, a lighting device can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing AC incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting—work lights, etc., mirrors/vanity lighting, or any other light emitting device.

The present inventive subject matter further relates to an illuminated enclosure (the volume of which can be illuminated uniformly or non-uniformly), comprising an enclosed space and at least one lighting device according to the present inventive subject matter, wherein the lighting device illuminates at least a portion of the enclosed space (uniformly or non-uniformly).

The present inventive subject matter is further directed to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, etc., having mounted therein or thereon at least one lighting device as described herein.

The expression "dominant emission wavelength", as used herein, means (1) in the case of a solid state light emitter, the dominant wavelength of light that the solid state light emitter emits if it is illuminated, and (2) in the case of a luminescent material, the dominant wavelength of light that the luminescent material emits if it is excited.

The expression "peak emission wavelength", as used herein, means (1) in the case of a solid state light emitter, the peak wavelength of light that the solid state light emitter emits if it is illuminated, and (2) in the case of a luminescent material, the peak wavelength of light that the luminescent material emits if it is excited.

The expression "at least one first light emitter" encompasses a single light emitter and a plurality of light emitters (and likewise for the expression "at least one second light emitter").

The expression "wall plug efficiency", as used herein, is measured in lumens per watt, and means lumens exiting a lighting device, divided by all energy supplied to create the light, as opposed to values for individual components and/or assemblies of components. Accordingly, wall plug efficiency, as used herein, accounts for all losses, including, inter alia, any quantum losses, i.e., losses generated in converting line voltage into current supplied to light emitters, the ratio of the number of photons emitted by luminescent material(s) divided by the number of photons absorbed by the luminescent material(s), any Stokes losses, i.e., losses due to the change in frequency involved in the absorption of light and the re-emission of visible light (e.g., by luminescent material (s)), and any optical losses involved in the light emitted by a component of the lighting device actually exiting the lighting device. In some embodiments, the lighting devices in accordance with the present inventive subject matter provide the wall plug efficiencies specified herein when they are supplied with AC power (i.e., where the AC power is converted to DC power before being supplied to some or all components, the lighting device also experiences losses from such conversion), e.g., AC line voltage. The expression "line voltage" is used in accordance with its well known usage to refer to electricity supplied by an energy source, e.g., electricity supplied from a grid, including AC and DC.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As noted above, in some embodiments of the present inventive subject matter, there is provided a solid state lighting device comprising: at least one first light emitter that emits non-white light and at least one second light emitter that emits non-white light. As also noted above, the expression "non-white", as used herein, means light that has a color point that is spaced by at least a unit distance of 0.01 (in the scale of u' v' coordinates) from the nearest point on the blackbody locus in a 1976 CIE Chromaticity Diagram. In any embodiments according to the present inventive subject matter, the non-white light emitted by one or more of the at least one first light emitter, and/or the non-white light emitted by one or more of the at least one second light emitter can have a color point that is spaced by at least a unit distance of 0.015 (or at least a unit distance of 0.02, 0.03, 0.04, 0.05, 0.06, 0.07, 0.08, 0.09, 0.10, 0.11, 0.12, 0.13, 0.14, 0.15, 0.16, 0.17, 0.18, 0.19 or 0.20). In any embodiments according to the present inventive subject matter (including any in accordance with the previous sentence), a combination of the non-white light emitted by one or more of the at least one first light emitter and the non-white light emitted by one or more of the at least one second light emitter and/or the light emitted by the lighting device, can have a color point that is spaced by at least a unit distance of 0.015 (or at least a unit distance of 0.02, 0.03, 0.04, 0.05, 0.06, 0.07, 0.08, 0.09, 0.10, 0.11, 0.12, 0.13, 0.14, 0.15, 0.16, 0.17, 0.18, 0.19 or 0.20).

Various embodiments of the present inventive subject matter can comprise at least one first light emitter that emits non-saturated non-white light of a first color point. In such embodiments, the at least one first light emitter can be any desired light emitter that emits non-saturated non-white light (or any desired combination of light emitters that, in combination, emit non-saturated non-white light). Persons of skill in the art are familiar with, and have ready access to, and can envision a wide variety of lighting components, and combinations of lighting components, that can provide non-saturated non-white light, and any of such components and combinations of components can be employed in accordance with the present inventive subject matter. The at least one first light emitter can consist of a single source of light, or can comprise a plurality of sources of light which can be any combination of the same types of components and/or different types of components, and which can be any combination of emitters that emit light of the same or similar wavelength(s) (or wavelength ranges), and/or of different wavelength(s) (or wavelength ranges). By way of representative, non-limiting examples, a lighting device according to the present inventive subject matter can comprise three light emitters of a first type, two light emitters of a second type and one light emitter or a third type; or it can comprise six light emitters of a fourth type. Similarly, a lighting device according to the present inventive subject matter can comprise three light emitters that emit non-saturated light of a first wavelength range, two light emitters that emit saturated light of a second peak wavelength, and one light emitter that emits non-saturated light of a third wavelength range that partially overlaps the first wavelength range).

In some embodiments, the at least one first light emitter comprises one or more solid state light emitters, and/or one or more luminescent materials. In some embodiments, the at least one first light emitter comprises at least two solid state light emitters that emit light of different colors.

A variety of solid state light emitters are well known, and any of such light emitters can be employed according to the present inventive subject matter. Representative examples of solid state light emitters include light emitting diodes (inorganic or organic, including polymer light emitting diodes (PLEDs, OLEDs)) with or without luminescent materials. Persons of skill in the art are familiar with, and have ready access to, a variety of solid state light emitters which, when illuminated, emit light of any of a wide variety of wavelengths, ranges of wavelengths, dominant emission wavelengths and peak emission wavelength, and any of such solid state light emitters, or any combinations of such solid state light emitters, can be employed in the at least one light source or as a supplemental light emitter in accordance with the present inventive subject matter.

Light emitting diodes are semiconductor devices that convert electrical current into light. A wide variety of light emitting diodes are used in increasingly diverse fields for an ever-expanding range of purposes. More specifically, light emitting diodes are semiconducting devices that emit light (ultraviolet, visible, or infrared) when a potential difference is applied across a p-n junction structure.

The expression "light emitting diode" is used herein to refer to the basic semiconductor diode structure (i.e., the chip). The commonly recognized and commercially available "LED" that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477; various wire connections, and a package that encapsulates the light emitting diode.

Persons of skill in the art are familiar with, and have ready access to, a variety of luminescent materials that emit light having a desired peak emission wavelength and/or dominant emission wavelength, or a desired hue, and any of such luminescent materials (discussed in more detail below), or any combinations of such luminescent materials, can be employed in embodiments that comprise luminescent material. For example, a variety of phosphors are readily available, such phosphors each being a luminescent material that emits a responsive radiation (e.g., visible light) when excited by a source of exciting radiation. In many instances, the responsive radiation has a wavelength which is different from the wavelength of the exciting radiation. Other examples of luminescent materials include scintillators, day glow tapes and inks which glow in the visible spectrum upon illumination with ultraviolet light.

Luminescent materials can be categorized as being down-converting, i.e., a material which converts photons to a lower energy level (longer wavelength) or up-converting, i.e., a material which converts photons to a higher energy level (shorter wavelength).

In embodiments where the lighting device includes one or more luminescent materials, the expression "illuminated" (or "illumination" or the like) can include light that has been up-converted or down-converted by one or more luminescent materials.

In some embodiments, one or more luminescent material can be included within a packaged solid state light emitter in any of a variety of ways known to persons of skill in the art, one representative way being by adding the luminescent materials to a clear or transparent encapsulant material (e.g., epoxy-based, silicone-based, glass-based or metal oxide-based material) as discussed above, for example by a blending or coating process, prior to solidifying the encapsulant material.

For example, one representative example of a conventional solid state light emitter lamp that comprises a solid state light emitter and luminescent material includes a light emitting diode chip, a bullet-shaped transparent housing to cover the light emitting diode chip, leads to supply current to the light emitting diode chip, and a cup reflector for reflecting the emission of the light emitting diode chip in a uniform direction, in which the light emitting diode chip is encapsulated with a first resin portion in which a luminescent material is dispersed, the first resin portion being further encapsulated with a second resin portion. The first resin portion can be obtained by filling the cup reflector with a resin material and curing it after the light emitting diode chip has been mounted onto the bottom of the cup reflector and then has had its cathode and anode electrodes electrically connected to the leads by way of wires. The luminescent material can be dispersed in the first resin portion so as to be excited with the light A that has been emitted from the light emitting diode chip, the excited luminescent material produces fluorescence ("light B") that has a longer wavelength than the light A, a portion of the light A is transmitted through the first resin portion including the luminescent material, and as a result, light C, as a mixture of the light A and light B, is used as illumination.

One non-limiting representative example of a luminescent material that can be employed in the present inventive subject matter is cerium-doped yttrium aluminum garnet (aka "YAG:Ce" or "YAG"). Below is a table (Table 1) showing x, y coordinates (along with u', v' coordinates) for representative color points for light emitted by YAG, along with values for the dominant wavelengths of such emissions.

TABLE 1

| x | y | u' | v' | dominant wavelength (nm) |
|---|---|----|----|--------------------------|
| 0.5393 | 0.4584 | 0.291 | 0.556 | 585 |
| 0.5219 | 0.4748 | 0.273 | 0.558 | 582 |
| 0.5073 | 0.4881 | 0.259 | 0.560 | 580 |
| 0.4897 | 0.5035 | 0.243 | 0.562 | 578 |
| 0.4720 | 0.5180 | 0.228 | 0.564 | 575 |
| 0.4573 | 0.5290 | 0.217 | 0.565 | 573 |
| 0.4395 | 0.5404 | 0.204 | 0.565 | 571 |
| 0.4214 | 0.5493 | 0.193 | 0.565 | 568 |
| 0.4060 | 0.5542 | 0.184 | 0.564 | 566 |
| 0.3870 | 0.5561 | 0.174 | 0.562 | 564 |
| 0.3671 | 0.5528 | 0.165 | 0.559 | 561 |
| 0.3500 | 0.5453 | 0.158 | 0.555 | 558 |
| 0.3289 | 0.5301 | 0.151 | 0.548 | 555 |

In some embodiments, YAG is used in generating light within the first area on the 1931 CIE Chromaticity Diagram as discussed above.

Another non-limiting representative example of a luminescent material that can be employed in the present inventive subject matter is CaAlSiN:Eu2+ (aka "CASN" or "BR01"). Below is a table (Table 2) showing x, y coordinates (along with u', v' coordinates) for representative color points for light emitted by CASN, along with values for the dominant wavelengths of such emissions.

TABLE 2

| x | y | u' | v' | dominant wavelength (nm) |
|---|---|----|----|--------------------------|
| 0.6711 | 0.3285 | 0.479 | 0.528 | 612 |
| 0.6614 | 0.3382 | 0.461 | 0.531 | 609 |
| 0.6525 | 0.3470 | 0.445 | 0.533 | 607 |
| 0.6408 | 0.3586 | 0.426 | 0.536 | 604 |
| 0.6280 | 0.3713 | 0.405 | 0.539 | 601 |
| 0.6165 | 0.3826 | 0.388 | 0.542 | 598 |
| 0.6017 | 0.3972 | 0.367 | 0.545 | 595 |

In some embodiments, CASN is used in generating light within the second area on the 1931 CIE Chromaticity Diagram as discussed above.

Representative examples of suitable solid state light emitters, including suitable light emitting diodes, luminescent materials, encapsulants, etc., are described in:

U.S. patent application Ser. No. 11/614,180, filed Dec. 21, 2006 (now U.S. Patent Publication No. 2007/0236911), the entirety of which is hereby incorporated by reference as if set forth in its entirety;

U.S. patent application Ser. No. 11/624,811, filed Jan. 19, 2007 (now U.S. Patent Publication No. 2007/0170447), the entirety of which is hereby incorporated by reference as if set forth in its entirety;

U.S. patent application Ser. No. 11/751,982, filed May 22, 2007 (now U.S. Patent Publication No. 2007/0274080), the entirety of which is hereby incorporated by reference as if set forth in its entirety;

U.S. patent application Ser. No. 11/753,103, filed May 24, 2007 (now U.S. Patent Publication No. 2007/0280624), the entirety of which is hereby incorporated by reference as if set forth in its entirety;

U.S. patent application Ser. No. 11/751,990, filed May 22, 2007 (now U.S. Patent Publication No. 2007/0274063), the entirety of which is hereby incorporated by reference as if set forth in its entirety;

U.S. patent application Ser. No. 11/736,761, filed Apr. 18, 2007 (now U.S. Patent Publication No. 2007/0278934), the entirety of which is hereby incorporated by reference as if set forth in its entirety;

U.S. patent application Ser. No. 11/936,163, filed Nov. 7, 2007 (now U.S. Patent Publication No. 2008/0106895), the entirety of which is hereby incorporated by reference as if set forth in its entirety;

U.S. patent application Ser. No. 11/843,243, filed Aug. 22, 2007 (now U.S. Patent Publication No. 2008/0084685), the entirety of which is hereby incorporated by reference as if set forth in its entirety;

U.S. patent application Ser. No. 11/870,679, filed Oct. 11, 2007 (now U.S. Patent Publication No. 2008/0089053), the entirety of which is hereby incorporated by reference as if set forth in its entirety;

U.S. patent application Ser. No. 12/117,148, filed May 8, 2008 (now U.S. Patent Publication No. 2008/0304261), the entirety of which is hereby incorporated by reference as if set forth in its entirety; and U.S. patent application Ser. No. 12/017,676, filed on Jan. 22, 2008 (now U.S. Patent Publication No. 2009-0108269), the entirety of which is hereby incorporated by reference as if set forth in its entirety.

Various embodiments of the present inventive subject matter can comprise at least one second light emitter that emits saturated non-white light. In such embodiments, the at least one second light emitter can comprise any desired light emitter (or emitters) that emits saturated non-white light. Persons of skill in the art are familiar with, and have ready access to, and can envision a wide variety of lighting components, and combinations of lighting components, that can provide saturated non-white light, and any of such components and combinations of components can be employed in accordance with the present inventive subject matter. The at least one second light emitter can consist of a single source of light, or can comprise a plurality of sources of light which can be any combination of the same types of components and/or different types of components, and which can be any combination of emitters that emit light of the same or similar wavelength(s) (or wavelength ranges), and/or of different wavelength(s) (or wavelength ranges). By way of non-limiting representative example, the at least one second light emitter can comprises one or more solid state light emitters, e.g., one or more light emitting diodes.

In some embodiments according to the present inventive subject matter, which may include or not include any of the features described above, the at least one second light emitter comprises a plurality of light emitters that each emit saturated non-white light. The selections of the respective light emitters of the at least one second light emitter can be so as to provide any desired combination of wavelengths. For example, in some of such embodiments, each of the solid state light emitters of the second light emitter emits light having a dominant emission wavelength within a range having a lower value and an upper value, the upper value being is not more than 10 nm larger than the lower value, and in other embodiments, at least one of the solid state light emitters of the second light emitter emits light having a dominant emission wavelength that differs by at least 10 nm (in some cases, at least 25 nm) from light emitted by at least one other of the solid state light emitters of the second light emitter (or three or more solid state light emitters differ from one another by at least 10 nm or at least 15 nm, etc.)

Various embodiments of the present inventive subject matter can comprise at least one second light emitter that comprises a second solid state light emitter. In such embodiments, the at least one second light emitter can comprise any desired solid state light emitter (or emitters). Persons of skill in the art are familiar with, and have ready access to, and can envision a wide variety of solid state light emitters, and combinations of solid state light emitters, and any of such solid state light emitters and combinations of solid state light emitters can be employed in accordance with the present inventive subject matter. The at least one second light emitter can consist of a single solid state light emitter, or can comprise a plurality of sources of light which can be any combination of the same types of components and/or different types of components, and which can be any combination of emitters that emit light of the same or similar wavelength(s) (or wavelength ranges), and/or of different wavelength(s) (or wavelength ranges). By way of non-limiting representative example, the at least one second light emitter can comprises one or more solid state light emitters, e.g., one or more light emitting diodes.

In some embodiments according to the present inventive subject matter, which may include or not include any of the features described above, the at least one second light emitter comprises a plurality of light emitters that each emit saturated non-white light. The selections of the respective light emitters of the at least one second light emitter can be so as to provide any desired combination of wavelengths. For example, in some of such embodiments, each of the solid state light emitters of the second light emitter emits light having a dominant emission wavelength within a range having a lower value and an upper value, the upper value being is not more than 10 nm larger than the lower value, and in other embodiments, at least one of the solid state light emitters of the second light emitter emits light having a dominant emission wavelength that differs by at least 10 nm (in some cases, at least 25 nm) from light emitted by at least one other of the solid state light emitters of the second light emitter (or three or more solid state light emitters differ from one another by at least 10 nm or at least 15 nm, etc.)

Various embodiments of the present inventive subject matter can comprise at least one first light emitter that emits light which, in an absence of any additional light, has x, y color coordinates which define a first color point which is within one of a first area on a 1931 CIE Chromaticity Diagram and a second area on a 1931 CIE Chromaticity Diagram, the first area being enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.29, 0.36, the second point having x, y coordinates of 0.32, 0.35, the third point having x, y coordinates of 0.41, 0.43, the fourth point having x, y coordinates of 0.44, 0.49, and the fifth point having x, y coordinates of 0.38, 0.53 (or, the first point has x, y coordinates of 0.32, 0.40, the second point has x, y coordinates of 0.36, 0.48, the third point has x, y coordinates of 0.43, 0.45, the fourth point has x, y coordinates of 0.42, 0.42, and the fifth point has x, y coordinates of 0.36, 0.38), the second area being enclosed by sixth, seventh, eighth and ninth line segments, the sixth line segment connecting a sixth point to a seventh point, the seventh line segment connecting the seventh point to an eighth point, the eighth line segment connecting the eighth point to a ninth point, and the ninth line segment connecting the ninth point to the sixth point, the sixth point having x, y coordinates of 0.57, 0.35, the seventh point having x, y coordinates of 0.62, 0.32, the eighth point having x, y coordinates of 0.37, 0.16, and the ninth point having x, y coordinates of 0.40, 0.23.

In such embodiments, the at least one first light emitter that emits light which, in an absence of any additional light, has x, y color coordinates which define a first color point which is within one of a first area on a 1931 CIE Chromaticity Diagram and a second area on a 1931 CIE Chromaticity Diagram can be any desired light emitter that emits light which is within one of the areas as described above. Persons of skill in the art are familiar with, and have ready access to, and can envision a wide variety of lighting components, and combinations of lighting components, that can provide light within the specified area on the 1931 CIE Chromaticity Diagram, and any of such components and combinations of components can be employed in accordance with the present inventive subject matter.

In some embodiments, the at least one first light emitter comprises at least one luminescent material that emits light of a second peak emission wavelength in the range of from about 555 nm to about 585 nm. In some of such embodiments, the at least one first light emitter further comprises at least one solid state light emitter that emits light of a first peak emission wavelength in the near UV range or in the range of from about 430 nm to about 483 nm, and some of the light emitted by the at least one solid state light emitter excites the luminescent material, to provide a mixture of light emitted by the solid state light emitter and light emitted by the luminescent material, the mixture having x, y color coordinates which define a first color point which is within the first area defined above.

In some embodiments, the at least one first light emitter comprises one or more light emitters that are selected, oriented and proportioned as described in U.S. Pat. No. 7,213,940, issued on May 8, 2007, the entirety of which is hereby incorporated by reference as if set forth in its entirety.

In some embodiments, the at least one first light emitter comprises at least one luminescent material that emits light of a second peak emission wavelength in the range of from about 590 nm to about 650 nm. In some of such embodiments, the at least one first light emitter further comprises at least one solid state light emitter that emits light of a first peak emission wavelength in the near UV range or in the range of from about 430 nm to about 483 nm, and some of the light emitted by the at least one solid state light emitter excites the luminescent material, to provide a mixture of light emitted by the solid state light emitter and light emitted by the luminescent material, the mixture having x, y color coordinates which define a first color point which is within the second area defined above.

Below is a table (Table 3) showing x, y coordinates (along with u', v' coordinates) for color points for light emitted by representative examples of suitable second light emitters, along with values for the dominant wavelengths of such emissions. For example, a single one of one of the light emitters listed in Table 3 can be used as the at least one second light emitter, a plurality of one of the light emitters listed in Table 3 can be used as the at least one second light emitter, or one or more of each of two or more of the light emitters listed in Table 3 can be used as the at least one second light emitter.

TABLE 3

| x | y | u' | v' | dominant wavelength (nm) |
|---|---|----|----|--------------------------|
| 0.1698 | 0.0068 | 0.248 | 0.022 | 428 |
| 0.1686 | 0.0077 | 0.245 | 0.025 | 432 |
| 0.1649 | 0.0109 | 0.235 | 0.035 | 440 |
| 0.1596 | 0.0163 | 0.222 | 0.051 | 448 |
| 0.1504 | 0.0272 | 0.199 | 0.081 | 457 |
| 0.1356 | 0.0514 | 0.162 | 0.138 | 467 |
| 0.1291 | 0.0698 | 0.144 | 0.175 | 471 |
| 0.1072 | 0.1349 | 0.097 | 0.276 | 480 |
| 0.0964 | 0.1775 | 0.078 | 0.324 | 483 |
| 0.1072 | 0.1349 | 0.097 | 0.276 | 480 |
| 0.0964 | 0.1775 | 0.078 | 0.324 | 483 |
| 0.0836 | 0.2739 | 0.055 | 0.403 | 489 |
| 0.0736 | 0.3645 | 0.041 | 0.454 | 494 |
| 0.0692 | 0.4440 | 0.034 | 0.488 | 498 |
| 0.0715 | 0.5605 | 0.030 | 0.526 | 504 |
| 0.0899 | 0.6377 | 0.034 | 0.548 | 510 |
| 0.0899 | 0.6377 | 0.034 | 0.548 | 510 |
| 0.1096 | 0.6942 | 0.039 | 0.562 | 515 |
| 0.1294 | 0.7231 | 0.045 | 0.570 | 520 |
| 0.1519 | 0.7390 | 0.053 | 0.575 | 525 |
| 0.1760 | 0.7440 | 0.061 | 0.578 | 530 |
| 0.2012 | 0.7406 | 0.070 | 0.580 | 535 |
| 0.2333 | 0.7277 | 0.083 | 0.581 | 540 |
| 0.3374 | 0.6588 | 0.132 | 0.580 | 555 |
| 0.4441 | 0.5547 | 0.203 | 0.569 | 570 |
| 0.4441 | 0.5547 | 0.203 | 0.569 | 570 |
| 0.6270 | 0.3725 | 0.404 | 0.539 | 600 |
| 0.6270 | 0.3725 | 0.404 | 0.539 | 600 |
| 0.6915 | 0.3083 | 0.520 | 0.522 | 620 |
| 0.6915 | 0.3083 | 0.520 | 0.522 | 620 |
| 0.7300 | 0.2700 | 0.611 | 0.508 | 660 |

In some embodiments of the present inventive subject matter, plural second light emitters that emit saturated light of different respective colors are provided, and one or more controllers are provided so that a user can select any of a variety of output light colors. The more different types of solid state light emitters that emit respective different colors of light, and the more solid state light emitters that emit light of each color, the greater the number of different output light colors that can be obtained.

The light emission from many solid state light emitters, such as light emitting diodes, can vary in response to temperature of the light emitter and/or age of the light emitter. For instance, light emitting diodes that emit red light tend to experience a significant decrease in intensity as they become warmer, e.g., as a result of being operated for long periods of time. Some embodiments according to the present inventive subject matter comprise supplying current to one or more of the strings of solid state light emitters in a device prior to measuring a first color output, in order to allow the solid state light emitters to heat up to (or near to) a temperature to which they will typically be heated when the lighting device is illuminated, in order to account for variance in intensity of some solid state light emitters resulting from variance in temperature (e.g., the intensity of many solid state light emitters decreases as temperature increases, in at least some temperature ranges). The particular duration that current should be supplied to the solid state light emitters (prior to measuring the first color output) will depend on the particular configuration of the lighting device. For example, the greater the thermal mass, the longer it will take for the solid state light emitters to approach their thermal equilibrium operating temperature. While a specific time for operating the lighting device prior to testing may be lighting device specific, in some embodiments, durations of from about 1 to about 60 minutes or more and, in specific embodiments, about 30 minutes, may be used.

In some instances, color output from a light emitter, or from a combination of light emitters, or from an entire lighting device, can be analyzed after the light emitters reach thermal equilibrium (e.g., while operating, the temperature of each of the light emitters will not vary substantially (e.g., more than 2 degrees C.) without a change in ambient or operating conditions). In such a case, the color analysis is said to be "with the light emitters at thermal equilibrium." For instance, in some embodiments according to the present inventive subject matter, which may include or not include any of the features described above, the first color point is within the first area or the second area with the lighting device at thermal equilibrium. As will be appreciated by those of skill in the art, the determination that a light emitter has reached thermal equilibrium may be made in many different ways. For example, the voltage across the light emitters may be measured. Thermal equilibrium may be reached when the voltage has stabilized. Similarly, when the wavelength output of the light emitters has stabilized, the light emitters will be at thermal equilibrium. Also, for phosphor converted LEDs, when the peak wavelengths of the phosphor component and the LED component have stabilized, the LEDs will be at thermal equilibrium.

In some instances, color output can be analyzed while the light emitters (or the entire lighting device) is at ambient temperature, e.g., substantially immediately after the light emitter (or light emitters, or the entire lighting device) is illuminated. The expression "at ambient temperature", as used herein, means that the light emitter(s) is within 2 degrees C. of the ambient temperature. As will be appreciated by those of skill in the art, the "ambient temperature" measurement may be taken by measuring the light output of the device in the first few milliseconds or microseconds after the device is energized.

In some embodiments according to the present inventive subject matter, which may include or not include any of the features described above, the first color point is within the first area or second area with the solid state lighting device at ambient temperature.

In some embodiments according to the present inventive subject matter, which may include or not include any of the features described above, the second color point is below the blackbody locus on the 1931 CIE Chromaticity Diagram with the solid state lighting device at thermal equilibrium.

In some embodiments according to the present inventive subject matter, which may include or not include any of the features described above, the second color point is below the blackbody locus on the 1931 CIE Chromaticity Diagram with the solid state lighting device at ambient temperature.

In some embodiments according to the present inventive subject matter, which may include or not include any of the features described above, the second color point is above the blackbody locus on the 1931 CIE Chromaticity Diagram with the solid state lighting device at thermal equilibrium.

In some embodiments according to the present inventive subject matter, which may include or not include any of the features described above, the second color point is above the blackbody locus on the 1931 CIE Chromaticity Diagram with the solid state lighting device at ambient temperature.

Some embodiments in accordance with the present inventive subject matter comprise one or more filters which remove at least some light from light emitted by the at least one first light emitter and/or at least some light emitted by the at least one second light emitter.

Persons of skill in the art are familiar with, and have ready access to, a wide variety of filters, and any desired filter (or filters), or combinations of different types of filters, can be employed in accordance with the present inventive subject matter. Such filters include (1) pass-through filters, i.e., filters in which light to be filtered is directed toward the filter, and some or all of the light passes through the filter (e.g., some of the light does not pass through the filter) and the light which passes through the filter is the filtered light, (2) reflection filters, i.e., filters in which light to be filtered is directed toward the filter, and some or all of the light is reflected by the filter (e.g., some of the light is not reflected by the filter) and the light which is reflected by the filter is the filtered light, and (3) filters which provide a combination of both pass-through filtering and reflection filtering.

The expression "at least one first light emitter that emits light which, in an absence of any additional light, has x, y color coordinates which define a first color point which is within one of a first area on a 1931 CIE Chromaticity Diagram and a second area on a 1931 CIE Chromaticity Diagram . . .", as used herein (where the areas on the 1931 CIE Chromaticity Diagram are as described above) encompasses arrangements comprising at least one light emitter and one or more filters, wherein the one or more filters remove light from the at least one first light emitter and/or the at least one second light emitter before, during or after the mixing of light from the at least one first light emitter and the at least one second light emitter. For instance, the present inventive subject matter encompasses lighting devices in which light from at least one first light emitter mixes with light from at least one second light emitter before the mixed light passes through a filter (and some of the light from the at least one first light emitter is removed by the filter, and/or some of the light from the at least one second light emitter is removed by the filter), as well as lighting devices in which light from at least one first light emitter is removed by a filter before it mixes with light from at least one second light emitter and/or light from at least one second light emitter is removed by a filter before it mixes with light from at least one first light emitter.

Representative examples of filters, and combinations of components are described in U.S. patent application Ser. No. 12/035,604, filed on Feb. 22, 2008 (now U.S. Patent Publication No. 2008/0259589), the entirety of which is hereby incorporated by reference as if set forth in its entirety.

In general, light of any combination and number of colors can be mixed in lighting devices according to the present inventive subject matter to make light within the first or second area as defined herein. Representative examples of blends of light colors, including blends which provide light within the first area on the 1931 CIE Chromaticity Diagram, are described in:

U.S. patent application Ser. No. 11/613,714, filed Dec. 20, 2006 (now U.S. Patent Publication No. 2007/0139920), the entirety of which is hereby incorporated by reference as if set forth in its entirety;

U.S. patent application Ser. No. 11/613,733, filed Dec. 20, 2006 (now U.S. Patent Publication No. 2007/0137074), the entirety of which is hereby incorporated by reference as if set forth in its entirety;

U.S. patent application Ser. No. 11/736,761, filed Apr. 18, 2007 (now U.S. Patent Publication No. 2007/0278934), the entirety of which is hereby incorporated by reference as if set forth in its entirety;

U.S. patent application Ser. No. 11/736,799, filed Apr. 18, 2007 (now U.S. Patent Publication No. 2007/0267983), the entirety of which is hereby incorporated by reference as if set forth in its entirety;

U.S. patent application Ser. No. 11/737,321, filed Apr. 19, 2007 (now U.S. Patent Publication No. 2007/0278503), the entirety of which is hereby incorporated by reference as if set forth in its entirety;

U.S. patent application Ser. No. 11/936,163, filed Nov. 7, 2007 (now U.S. Patent Publication No. 2008/0106895), the entirety of which is hereby incorporated by reference as if set forth in its entirety;

U.S. patent application Ser. No. 12/117,122, filed May 8, 2008 (now U.S. Patent Publication No. 2008/0304260), the entirety of which is hereby incorporated by reference as if set forth in its entirety;

U.S. patent application Ser. No. 12/117,131, filed May 8, 2008 (now U.S. Patent Publication No. 2008/0278940), the entirety of which is hereby incorporated by reference as if set forth in its entirety;

U.S. patent application Ser. No. 12/117,136, filed May 8, 2008 (now U.S. Patent Publication No. 2008/0278928), the entirety of which is hereby incorporated by reference as if set forth in its entirety;

U.S. Pat. No. 7,213,940, issued on May 8, 2007, the entirety of which is hereby incorporated by reference as if set forth in its entirety;

U.S. Patent Application No. 60/868,134, filed on Dec. 1, 2006, entitled "LIGHTING DEVICE AND LIGHTING METHOD" (inventors: Antony Paul van de Ven and Gerald H. Negley; the entirety of which is hereby incorporated by reference as if set forth in its entirety;

U.S. patent application Ser. No. 11/948,021, filed on Nov. 30, 2007 (now U.S. Patent Publication No. 2008/0130285), the entirety of which is hereby incorporated by reference as if set forth in its entirety;

U.S. patent application Ser. No. 12/248,220, filed on Oct. 9, 2008 (now U.S. Patent Publication No. 2009/0184616), the entirety of which is hereby incorporated by reference as if set forth in its entirety;

U.S. patent application Ser. No. 11/951,626, filed Dec. 6, 2007 (now U.S. Patent Publication No. 2008/0136313), the entirety of which is hereby incorporated by reference as if set forth in its entirety;

U.S. patent application Ser. No. 12/035,604, filed on Feb. 22, 2008 (now U.S. Patent Publication No. 2008/0259589), the entirety of which is hereby incorporated by reference as if set forth in its entirety;

U.S. patent application Ser. No. 12/117,148, filed May 8, 2008 (now U.S. Patent Publication No. 2008/0304261), the entirety of which is hereby incorporated by reference as if set forth in its entirety; and U.S. Patent Application No. 60/990,435, filed on Nov. 27, 2007, entitled "WARM WHITE ILLUMINATION WITH HIGH CRI AND HIGH EFFICACY" (inventors: Antony Paul van de Ven and Gerald H. Negley; the entirety of which is hereby incorporated by reference as if set forth in its entirety.

In some embodiments according to the present inventive subject matter, which may include or not include any of the features described above, the lighting device further comprises a power line, and if line voltage is supplied to the power line, the first color point and/or second color point characteristics will automatically be satisfied.

Persons of skill in the art are familiar with, and have ready access to, a variety of structures that can be used as a power line. A power line can be any structure that can carry electrical energy to a light emitter, such as a solid state light emitter. In some embodiments, a string of solid state light emitters, and/or an arrangement comprising a plurality of strings of solid state light emitters arranged in parallel, is/are arranged in series with a power line, such that current is supplied through a power line and is ultimately supplied to the string or strings. In some embodiments, power is supplied to a power line before and/or after going through a power supply.

Some embodiments in accordance with the present inventive subject matter employ one or more enclosing structures that surround the at least one first light emitter and the at least one second light emitter, and/or one or more reflective element, and/or one or more housings. In addition, the present inventive subject matter provides fixtures that comprise one or more lighting devices in accordance with the present inventive subject matter, and methods in which the at least one first light emitter and the at least one second light emitter are part of such a light fixture.

Persons of skill in the art are familiar with, and can readily envision, and have ready access to, a variety of enclosing structures, and any of such enclosing structures can be employed in embodiments in accordance with the present inventive subject matter.

Persons of skill in the art are familiar with, and can readily envision, and have ready access to, a variety of reflective elements, and any of such reflective elements can be employed in embodiments in accordance with the present inventive subject matter. Persons of skill in the art are familiar with, and can readily obtain, a wide variety of reflective materials for use in such reflective elements. A representative example of a suitable reflective material for such purposes is a material marketed by Furukawa (a Japanese corporation) under the trademark MCPET®.

Persons of skill in the art are familiar with, and can envision, a wide variety of materials out of which a housing can be constructed, and a wide variety of shapes for such housings, and housings made of any of such materials and having any of such shapes can be employed in accordance with the present inventive subject matter. In some embodiments that include a housing, at least a portion of the internal surface of the housing is highly reflective. As noted above, persons of skill in the art are familiar with, and can readily obtain, a wide variety of reflective materials, and any of such materials can be used in making such housings.

Persons of skill in the art are familiar with, and can readily envision, and have ready access to, a variety of components that can be used in making fixtures, and any of such fixture components can be employed in embodiments of fixtures in accordance with the present inventive subject matter.

For example, fixtures, other mounting structures and complete lighting assemblies which may be used in practicing the present inventive subject matter are described in:

U.S. patent application Ser. No. 11/613,692, filed Dec. 20, 2006 (now U.S. Patent Publication No. 2007/0139923), the entirety of which is hereby incorporated by reference as if set forth in its entirety;

U.S. patent application Ser. No. 11/743,754, filed May 3, 2007 (now U.S. Patent Publication No. 2007/0263393), the entirety of which is hereby incorporated by reference as if set forth in its entirety;

U.S. patent application Ser. No. 11/755,153, filed May 30, 2007 (now U.S. Patent Publication No. 2007/0279903), the entirety of which is hereby incorporated by reference as if set forth in its entirety;

U.S. patent application Ser. No. 11/856,421, filed Sep. 17, 2007 (now U.S. Patent Publication No. 2008/0084700), the entirety of which is hereby incorporated by reference as if set forth in its entirety;

U.S. patent application Ser. No. 11/859,048, filed Sep. 21, 2007 (now U.S. Patent Publication No. 2008/0084701), the entirety of which is hereby incorporated by reference as if set forth in its entirety;

U.S. patent application Ser. No. 11/939,047, filed Nov. 13, 2007 (now U.S. Patent Publication No. 2008/0112183), the entirety of which is hereby incorporated by reference as if set forth in its entirety;

U.S. patent application Ser. No. 11/939,052, filed Nov. 13, 2007 (now U.S. Patent Publication No. 2008/0112168), the entirety of which is hereby incorporated by reference as if set forth in its entirety;

U.S. patent application Ser. No. 11/939,059, filed Nov. 13, 2007 (now U.S. Patent Publication No. 2008/0112170), the entirety of which is hereby incorporated by reference as if set forth in its entirety;

U.S. patent application Ser. No. 11/877,038, filed Oct. 23, 2007 (now U.S. Patent Publication No. 2008/0106907), the entirety of which is hereby incorporated by reference as if set forth in its entirety;

U.S. Patent Application No. 60/861,901, filed on Nov. 30, 2006, entitled "LED DOWNLIGHT WITH ACCESSORY ATTACHMENT" (inventors: Gary David Trott, Paul Kenneth Pickard and Ed Adams; the entirety of which is hereby incorporated by reference as if set forth in its entirety;

U.S. patent application Ser. No. 11/948,041, filed Nov. 30, 2007 (now U.S. Patent Publication No. 2008/0137347), the entirety of which is hereby incorporated by reference as if set forth in its entirety;

U.S. patent application Ser. No. 12/114,994, filed May 5, 2008 (now U.S. Patent Publication No. 2008/0304269), the entirety of which is hereby incorporated by reference as if set forth in its entirety;

U.S. patent application Ser. No. 12/116,341, filed May 7, 2008 (now U.S. Patent Publication No. 2008/0278952), the entirety of which is hereby incorporated by reference as if set forth in its entirety;

U.S. patent application Ser. No. 12/116,346, filed May 7, 2008 (now U.S. Patent Publication No. 2008/0278950), the entirety of which is hereby incorporated by reference as if set forth in its entirety;

U.S. patent application Ser. No. 12/116,348, filed on May 7, 2008 (now U.S. Patent Publication No. 2008/0278957), the entirety of which is hereby incorporated by reference as if set forth in its entirety;

U.S. Patent Application No. 61/108,130, filed on Oct. 24, 2008, entitled "LIGHTING DEVICE WHICH INCLUDES ONE OR MORE SOLID STATE LIGHT EMITTING DEVICE" (inventors: Antony Paul van de Ven and Gerald H. Negley; the entirety of which is hereby incorporated by reference as if set forth in its entirety;

U.S. Patent Application No. 61/108,133, filed on Oct. 24, 2008, entitled "LIGHTING DEVICE" (inventors: Gerald H. Negley and Antony Paul van de Ven; the entirety of which is hereby incorporated by reference as if set forth in its entirety; and U.S. Patent Application No. 61/108,149, filed on Oct. 24, 2008, entitled "LIGHTING DEVICE, HEAT TRANSFER STRUCTURE AND HEAT TRANSFER ELEMENT" (inventors: Antony Paul van de Ven and Gerald H. Negley; the entirety of which is hereby incorporated by reference as if set forth in its entirety.

Table 4 below provides representative examples of color bins (i.e., areas on a CRI diagram that encompass color points for light emitters) for light emitters which would be suitable, alone or in combination with light emitters of one or more other color bins, for use in providing one or more light sources according to the present inventive subject matter. Each of the bins (XA, XB, XC, XD, XE, XF, XG, XH, XJ, XK, XM, XN and XP) is four-sided, with the sides being defined by the listed x,y coordinates of the four corners of the bins. Other color bins can readily be envisioned and are encompassed by the present inventive subject matter. Representative combinations of the bins set forth in Table 4 include (XN, XF), (XM, XE), (XA, XD), (XB, XC), (XC, XK), (XD, XJ), (XE, XH) and (XF, XG). For each combination of bins, at least a portion of a tie line between the combined color output of the solid state light emitters on the first string and the combined color output of the solid state light emitters on the second string can be within a region defined by the outer perimeter of a shape which surrounds the color bins.

TABLE 4

Chromaticity Region Bounding Coordinates

| Region | x | y |
|---|---|---|
| XA | 0.3697 | 0.4738 |
|  | 0.4008 | 0.4584 |
|  | 0.3953 | 0.4487 |
|  | 0.3640 | 0.4629 |
| XB | 0.3640 | 0.4629 |
|  | 0.3953 | 0.4487 |
|  | 0.3892 | 0.438 |
|  | 0.3577 | 0.4508 |
| XC | 0.3577 | 0.4508 |
|  | 0.3892 | 0.4380 |
|  | 0.3845 | 0.4296 |
|  | 0.3528 | 0.4414 |
| XD | 0.3528 | 0.4414 |
|  | 0.3845 | 0.4296 |
|  | 0.3798 | 0.4212 |
|  | 0.3479 | 0.4320 |
| XE | 0.3479 | 0.4320 |
|  | 0.3798 | 0.4212 |
|  | 0.3747 | 0.4122 |
|  | 0.3426 | 0.4219 |
| XF | 0.3426 | 0.4219 |
|  | 0.3747 | 0.4122 |
|  | 0.3696 | 0.4031 |
|  | 0.3373 | 0.4118 |
| XG | 0.3373 | 0.4118 |
|  | 0.3696 | 0.4031 |
|  | 0.3643 | 0.3937 |
|  | 0.3318 | 0.4013 |
| XH | 0.3318 | 0.4013 |
|  | 0.3643 | 0.3937 |
|  | 0.3590 | 0.3843 |
|  | 0.3263 | 0.3908 |
| XJ | 0.3263 | 0.3908 |
|  | 0.3590 | 0.3843 |
|  | 0.3543 | 0.3759 |
|  | 0.3215 | 0.3815 |
| XK | 0.3215 | 0.3815 |
|  | 0.3543 | 0.3759 |
|  | 0.3496 | 0.3675 |
|  | 0.3166 | 0.3722 |
| XM | 0.3762 | 0.4863 |
|  | 0.4070 | 0.4694 |
|  | 0.4008 | 0.4584 |
|  | 0.3697 | 0.4738 |
| XN | 0.3836 | 0.5004 |
|  | 0.4140 | 0.4819 |
|  | 0.4070 | 0.4694 |

TABLE 4-continued

Chromaticity Region Bounding Coordinates

| Region | x | y |
|---|---|---|
| XP | 0.3762 | 0.4863 |
| | 0.3920 | 0.5164 |
| | 0.4219 | 0.4960 |
| | 0.4140 | 0.4819 |
| | 0.3836 | 0.5004 |

In some embodiments according to the present inventive subject matter, the lighting device further comprises a sensor which detects an intensity of light emitted by one or more strings of solid state light emitters, and circuitry which adjusts a current supplied to such one or more strings of solid state light emitters in response to that intensity. Persons of skill in the art are familiar with a variety of sensors which can detect an intensity of light emitted by one or more solid state light emitters, and any of such sensors can be used in making or carrying out such embodiments. Similarly, persons of skill in the art are familiar with a variety of types of circuitry that can adjust a current supplied to one or more strings of solid state light emitters (or adjust currents supplied independently to each of plural strings of solid state light emitters) in response to any signal or command (e.g., intensity detected by the sensor(s)), and any of such types of circuitry can be employed in the devices and methods according to the present inventive subject matter. For example, in some embodiments according to the present inventive subject matter, the current supplied to a third string of solid state lighting devices can be set to a particular value for the intensity of the combined light emitted by the solid state lighting devices in first and second strings of solid state lighting devices as detected during testing (i.e., their initial combined intensity), and the current supplied to the third string can be varied (linearly or non-linearly) from that set value in response to variance in the intensity of the combined light emitted by the solid state lighting devices in the first and second strings of solid state lighting devices over time (e.g., as the intensity of the solid state lighting devices in the first and second strings of solid state lighting devices decreases over time, the current supplied to the third string of solid state lighting devices can be varied in order to reduce or minimize deviation of the combined color output of the lighting device over time. Skilled artisans are familiar with a variety of ways to provide such a relationship, e.g., by providing a sensor feedback which, in response to variances in the intensity of the combined light emitted by the solid state lighting devices in the first and second strings of solid state lighting devices, adjusts a reference voltage for the third string.

Some embodiments of the present inventive subject matter include measuring color output of a lighting device while supplying current to one or more strings of solid state light emitters, and adjusting the current supplied to at least one of the first string of solid state light emitters. Persons of skill in the art are familiar with a variety of devices and techniques for measuring color output, and any of such devices and techniques can be employed in the devices and methods according to the present inventive subject matter. Similarly, persons of skill in the art are familiar with a wide variety of devices and techniques for adjusting current supplied to one or more strings of solid state light emitters, and any of such devices and techniques can be employed in the devices and methods according to the present inventive subject matter. Thus, the currents are tunable based upon characteristics of the specific device (and components thereof) being used.

In some lighting devices according to the present inventive subject matter, there are further included one or more circuitry components, e.g., drive electronics for supplying and controlling current passed through at least one of the one or more solid state light emitters in the lighting device. Persons of skill in the art are familiar with a wide variety of ways to supply and control the current passed through solid state light emitters, and any such ways can be employed in the devices of the present inventive subject matter. For example, such circuitry can include at least one contact, at least one leadframe, at least one current regulator, at least one power control, at least one voltage control, at least one boost, at least one capacitor and/or at least one bridge rectifier, persons of skill in the art being familiar with such components and being readily able to design appropriate circuitry to meet whatever current flow characteristics are desired.

Representative examples of apparatuses for supplying electricity to lighting devices and power supplies for lighting devices, all of which are suitable for the lighting devices of the present inventive subject matter, are described in:

U.S. patent application Ser. No. 11/626,483, filed Jan. 24, 2007 (now U.S. Patent Publication No. 2007/0171145), the entirety of which is hereby incorporated by reference as if set forth in its entirety;

U.S. patent application Ser. No. 11/755,162, filed May 30, 2007 (now U.S. Patent Publication No. 2007/0279440), the entirety of which is hereby incorporated by reference as if set forth in its entirety;

U.S. patent application Ser. No. 11/854,744, filed Sep. 13, 2007 (now U.S. Patent Publication No. 2008/0088248), the entirety of which is hereby incorporated by reference as if set forth in its entirety;

U.S. patent application Ser. No. 12/117,280, filed May 8, 2008 (now U.S. Patent Publication No. 2008/0309255), the entirety of which is hereby incorporated by reference as if set forth in its entirety; and U.S. patent application Ser. No. 12/328,144, filed Dec. 4, 2008 (now U.S. Patent Publication No. 2009/0184666), the entirety of which is hereby incorporated by reference as if set forth in its entirety.

The lighting devices according to the first aspect of the present inventive subject matter can further comprise any desired electrical connector, a wide variety of which are familiar to those of skill in the art, e.g., an Edison connector (for insertion in an Edison socket), a GU-24 connector, etc.

In some embodiments according to the present inventive subject matter, the lighting device is a self-ballasted device. For example, in some embodiments, the lighting device can be directly connected to AC current (e.g., by being plugged into a wall receptacle, by being screwed into an Edison socket, by being hard-wired into a circuit, etc.). Representative examples of self-ballasted devices are described in U.S. patent application Ser. No. 11/947,392, filed on Nov. 29, 2007 (now U.S. Patent Publication No. 2008/0130298), the entirety of which is hereby incorporated by reference as if set forth in its entirety.

Some embodiments in accordance with the present inventive subject matter comprise a controller configured to control a ratio of non-white light of a first color point emitted by at least one first light emitter and saturated non-white light emitted by at least one second light emitter such that a combination of the non-white light of the first color point emitted by the at least one first light emitter and the saturated non-white light emitted by the at least one second light emitter is non-saturated, non-white light of a second color point.

Persons of skill in the art are familiar with, have access to, and can readily envision a variety of suitable controllers that can be used to control the above ratio so as to provide non-white light of a desired second color point, and any of such controllers can be employed in accordance with the present inventive subject matter.

A controller may be a digital controller, an analog controller or a combination of digital and analog. For example, the controller may be an application specific integrated circuit (ASIC), a microprocessor, a microcontroller, a collection of discrete components or combinations thereof. In some embodiments, the controller may be programmed to control the lighting devices. In some embodiments, control of the lighting devices may be provided by the circuit design of the controller and is, therefore, fixed at the time of manufacture. In still further embodiments, aspects of the controller circuit, such as reference voltages, resistance values or the like, may be set at the time of manufacture so as to allow adjustment of the control of the lighting devices without the need for programming or control code.

Representative examples of suitable controllers are described in:

U.S. patent application Ser. No. 11/755,149, filed May 30, 2007 (now U.S. Patent Publication No. 2007/0278974), the entirety of which is hereby incorporated by reference as if set forth in its entirety;

U.S. patent application Ser. No. 12/117,280, filed May 8, 2008 (now U.S. Patent Publication No. 2008/0309255), the entirety of which is hereby incorporated by reference as if set forth in its entirety; and U.S. patent application Ser. No. 12/257,804, filed on Oct. 24, 2008 (now U.S. Patent Publication No. 2009/0160363), the entirety of which is hereby incorporated by reference as if set forth in its entirety.

Some embodiments in accordance with the present inventive subject matter include one or more lenses or diffusers. Persons of skill in the art are familiar with a wide variety of lenses and diffusers, and can readily envision a variety of materials out of which a lens or a diffuser can be made, and are familiar and/or can envision a wide variety of shapes that lenses and diffusers can be. Any of such materials and/or shapes can be employed in a lens and/or a diffuser in an embodiment that includes a lens and/or a diffuser. As will be understood by persons skilled in the art, a lens or a diffuser in a lighting device according to the present inventive subject matter can be selected to have any desired effect on incident light (or no effect), such as focusing, diffusing, etc.

In embodiments in accordance with the present inventive subject matter that include one or more lenses and/or one or more diffusers, the lens(es) and/or the diffuser(s) can be positioned in any desired location and orientation.

In some embodiments in accordance with the present inventive subject matter, some or all of the energy supplied to the at least one light source and/or the first group of solid state light emitters is supplied by one or more batteries and/or by one or more photovoltaic energy collection device (i.e., a device which includes one or more photovoltaic cells which converts energy from the sun into electrical energy).

Embodiments in accordance with the present inventive subject matter are described herein with reference to cross-sectional (and/or plan view) illustrations that are schematic illustrations of idealized embodiments of the present inventive subject matter. As such, variations from the shapes of the illustrations as a result, for example, of manufacturing techniques and/or tolerances, are to be expected. Thus, embodiments of the present inventive subject matter should not be construed as limited to the particular shapes of regions illustrated herein but are to include deviations in shapes that result, for example, from manufacturing. For example, a molded region illustrated or described as a rectangle will, typically, have rounded or curved features. Thus, the regions illustrated in the figures are schematic in nature and their shapes are not intended to illustrate the precise shape of a region of a device and are not intended to limit the scope of the present inventive subject matter.

FIG. 1 depicts a first embodiment of a lighting device in accordance with the present inventive subject matter.

Referring to FIG. 1, there is shown a lighting device 10 which includes a heat spreading element 11 (formed of aluminum), insulating regions 12 (comprising any desired material which is thermally conductive and not electrically conductive, a wide variety of which are well known to those skilled in the art, e.g., ceramic, epoxy or silicone optionally filled with silicon carbide, diamond, cubic boron nitride, alumina, etc), a highly reflective surface 13 (formed in situ by polishing the surface of the aluminum heat spreading element, or made of MCPET® (marketed by Furukawa, a Japanese corporation)), conductive traces 14 formed of copper, lead frames 15 formed of silver-plated copper (or silver-plated mild steel), packaged LEDs 16a, 16b (described in more detail below), a reflective cone 17 (made of MCPET®) with a diffuse light scattering surface and a diffusing element 18 (the diffusing element 18 performs a light scattering function).

The thickness of the heat spreading element 11 is about 3.0 mm.

The reflective cone 17 is about 1 mm thick.

The diffusing element 18 is about 3.0 mm thick and is made of glass or plastic with surface features.

The device depicted in FIG. 1 further includes a printed circuit board (PCB) 28 with the conductive traces 14. The PCB is about 1.6 mm thick and is FR4.

Referring to FIG. 2, which is a schematic electrical diagram of a portion of the circuitry in the device depicted in FIG. 1, the lighting device includes a first string 41 of LEDs, a second string 42 of LEDs and a third string 43 of LEDs arranged in parallel with one another and being electrically connected to a common power line 44.

Connected to the first string 41 of LED emitters are a current regulator 45, forty-seven second light emitters, namely, LEDs 16a (shown in more detail in FIG. 3—only two are depicted in FIG. 2) that emit light having dominant emission wavelength in the range of from about 590 nm to about 660 nm, and twenty-one first light emitters 16b that emit light that has x, y color coordinates which define a point which is within the first area on the 1931 CIE Chromaticity Diagram as described above (each emitter 16b including a blue LED and a broad spectrum emitting lumiphor, i.e., an element containing luminescent material) (a first light emitter 16b is shown in more detail in FIG. 4—only two are depicted in FIG. 2).

Accordingly, in this embodiment, a first string ratio of second light emitters 16a to first light emitters 16b is 47 divided by 21, i.e., about 2.24.

Connected to the second string 42 of LED emitters are a current regulator 46, zero second light emitters and fifty-one first light emitters 16b that emit light that has x, y color coordinates which define a point which is within the first area on the 1931 CIE Chromaticity Diagram as described above (only two are depicted in FIG. 2).

Accordingly, in this embodiment, a second string ratio of second light emitters 16a to first light emitters 16b is 0 divided by 51, i.e., 0, which differs from the first string ratio.

Connected to the third string 43 of LED emitters are a current regulator 47, zero second light emitters and fifty-one first light emitters 16b that emit light that has x, y color coordinates which define a point which is within the first area on the 1931 CIE Chromaticity Diagram as described above (only two are depicted in FIG. 2).

Accordingly, in this embodiment, a third string ratio of second light emitters 16a to first light emitters 16b is 0 divided by 51, i.e., 0, which differs from the first string ratio.

The voltage drop across each of the second light emitters 16a is about 2 volts.

The voltage drop across each of the blue LEDs (in the first light emitters 16b that emit light that has x, y color coordinates which define a point which is within the first area on the 1931 CIE Chromaticity Diagram as described above) is about 3 volts.

The voltage drop across each of the current regulators is about 7 volts.

The current passing through the first string 41 of LED emitters is regulated and/or adjusted to be about 20 milliamps.

The current passing through the second string 42 of LED emitters is regulated and/or adjusted to be about 20 milliamps.

The current passing through the third string 43 of LED emitters is regulated and/or adjusted to be about 20 milliamps.

The diffusing element 18 is located about two inches from the heat spreading element 11. The diffusing element 18 is attached to a top region of the reflective cone 17. The insulating element 28 is also attached to a bottom region of the reflective cone 17. A mixture of light emitted from the first light emitters 16b and from the second light emitters 16a exits from a remote end of the reflective cone 17, i.e., through the diffusing element 18.

The heat spreading element 11 serves to spread out the heat, act as a heat sink, and dissipate the heat from the LEDs. Likewise, the reflective cone 17 functions as a heat sink.

Figure 5:
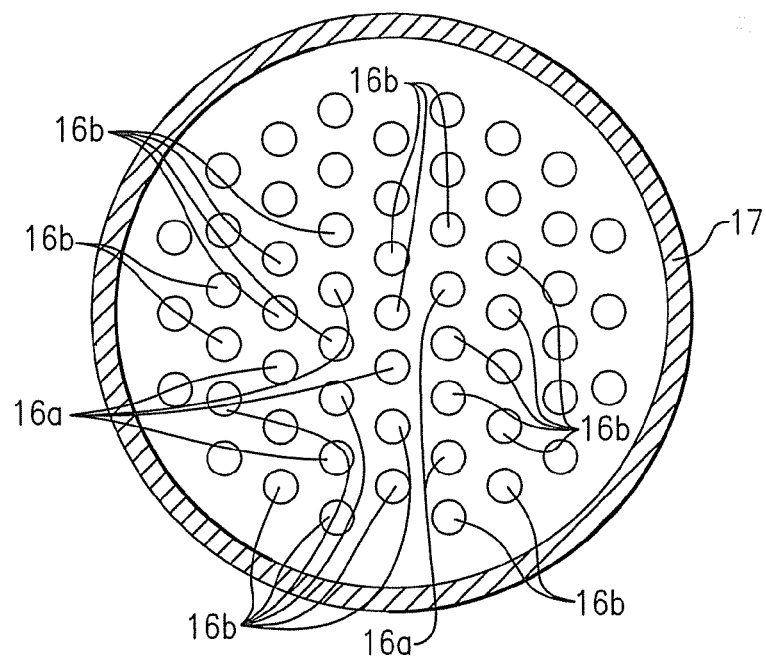
FIG. 5 is a sectional view taken along plane V-V shown in FIG. 1.

FIG. 5 is a sectional view taken along plane V-V shown in FIG. 1.

As shown in FIG. 5, each of the second light emitters 16a is surrounded by five or six first light emitters 16b, i.e., the second light emitters 16a and the first light emitters 16b are arranged in generally laterally arranged rows and spaced from one another substantially evenly, each row being laterally offset from the next adjacent (in a longitudinal direction) row by half the distance between laterally adjacent LEDs, with, in most locations, two first light emitters 16b being located between each second light emitter 16a and its nearest second light emitter 16a neighbor in the same row, and with the second light emitters 16a in each row being offset from the nearest second light emitter 16a in the next adjacent (in a longitudinal direction) row by one and a half times the distance between laterally spaced adjacent LEDs. The spacing between each adjacent LED in each row is about 6 mm.

FIG. 3 is a cross-sectional view of one of the second light emitters 16a employed in the embodiment depicted in FIGS. 1 and 5.

Referring to FIG. 3, each of the second light emitters 16a includes a supplemental light emitting diode chip 21 (from Epistar in Taiwan, measuring 14 mils×14 mils, comprising AlInGaP and having a brightness of not less than 600 mcd), a lead frame 15 having a reflective surface 22, a copper wire 23, and an encapsulant region 24. The reflective surface 22 is made of silver. The encapsulant region 24 is made of Hysol OS 4000. The second light emitters 16a are nearly saturated, i.e., they have a purity of at least 85%, the term "purity" having a well known meaning to persons skilled in the art, and procedures for calculating purity being well known to those of skill in the art.

FIG. 4 is a cross-sectional view of one of the first light emitters 16b employed in the embodiment depicted in FIGS. 1 and 5.

Referring to FIG. 4, each of the first light emitters 16b includes a blue light emitting diode chip 31 (namely, a Cree XT LED (C460XT290) die with a wavelength range of from about 450 nm to about 465 nm, and optical power greater than 24 mW), a lead frame 15 having a reflective surface 32, a copper wire 33, an encapsulant region 34, and a broad spectrum emitting lumiphor 35. The reflective surface 32 is made of silver. The encapsulant region 34 is made of Hysol OS400 or GE/Toshiba Invisil 5332. The lumiphor 35 comprises a luminescent material consisting of QMK58/F-U1 YAG:Ce by Phosphor Teck—UK dispersed in a binder made of Hysol OS400 or GE/Toshiba 5332. The luminescent material is loaded in the binder in an amount in the range of from about 10 to about 12 percent by weight, based on the total weight of the binder and the luminescent material. The luminescent material particles have particle sizes in the range of from about 1.6 micrometers to about 8.6 micrometers, with the mean particle size being in the range of from about 4 micrometers to about 5 micrometers. The lumiphor 35 is spaced from the chip 31 by a distance in the range of from about 100 micrometers to about 750 micrometers (for example, from about 500 micrometers to about 750 micrometers, e.g., about 750 micrometers). The blue chip 31 emits light having a peak emission wavelength in the range of from about 450 nm to about 465 nm, and the luminescent material emits light having a dominant emission wavelength in the range of from about 555 nm to about 585 nm.

The combined light exiting the lighting device 10, i.e., a combination of (1) light exiting the lighting device 10 which was emitted by the first light emitters 16b and (2) light exiting the lighting device 10 which was emitted by the second light emitters 16a corresponds to a point on a 1931 CIE Chromaticity Diagram which is in the third area defined above.

Figure 6:
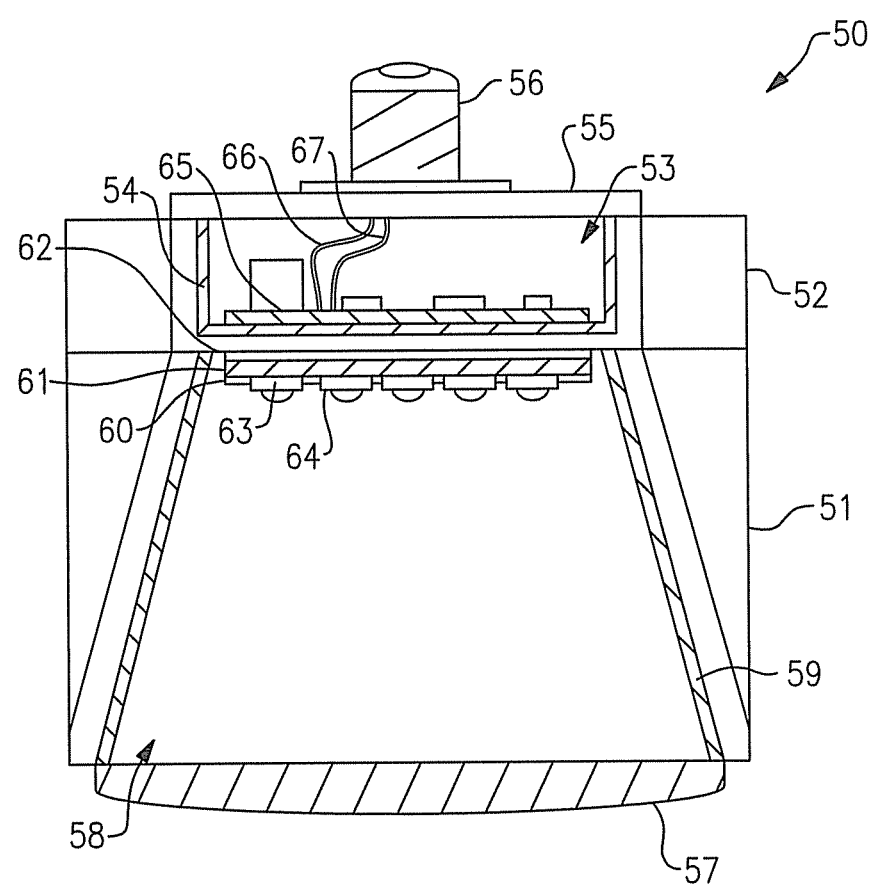
FIG. 6 is a schematic diagram of a high efficiency lamp 50 according to a second embodiment in accordance with the inventive subject matter.

FIG. 6 is a schematic diagram of a high efficiency lamp 50 according to a second embodiment in accordance with the inventive subject matter. The lamp 50 includes a lower housing 51 and an upper housing 52, first light emitters 63 and second light emitters 64. The lower housing 51 is a cast aluminum housing having fins surrounding the circumference and provides sidewalls of the mixing enclosure 58. The lower housing may be a lower housing of an LR6 fixture from Cree LED Lighting Solutions, Inc., Durham, N.C., with the trim flange removed such that the housing does not extend past the lens 57. Other suitable lower housing materials having similar thermal properties could also be utilized. The lower housing 51 and the lens 57, in combination, comprise an enclosing structure that surrounds the first light emitters 63 and the second light emitters 64.

The upper housing 52 includes a cavity 53 and also has fins to increase the overall area for heat extraction. The upper housing 52 has substantially the same configuration as the upper housing of the LR6 fixture. In the present embodiment, the upper housing 52 is made from copper. Other suitable upper housing materials having similar thermal properties could also be utilized. For example, the upper housing could be made from aluminum or other thermally conductive material. An electrically insulating layer 54 is provided within the upper housing 52 to isolate the power supply 65 from the upper housing 52. The insulating layer 54 may, for example, be Formex. A thermal gasket (not shown) is provided between the upper housing 52 and the lower housing 51 to assure a good thermal coupling between the two housings. The thermal gasket may, for example, be Sil-Pad from The Bergquist Company.

A top plate 55 is provided on the upper housing 52 and encloses the cavity 53. A connector 56, such as an Edison type screw connector, is provided on the top plate 55 to allow connection of the lamp 50 to a power source, such as an AC line. Other connector types could be utilized and may depend on the power source to which the lamp 50 is to be connected.

A lens 57 is provided on the opening of the lower housing 51 to provide a mixing enclosure 58 having sidewalls defined by the lower housing 51 and opposing ends formed by the upper housing 52 and the lens 57. The mixing enclosure 58 is a frustoconical shape with a height of about 2.15" and with a diameter at one end of 2.91" and of 4.56" at the opposing end. The lens 57 includes optical features on the side facing the light sources that obscures the light sources and mixes the light. The lens used in the present embodiment is a lens from the LR6 fixture that is provided by RPC Photonics, Rochester, N.Y. In general, the lens 57 has a full width, half max (FWHM) of between 50° and 60°, which balances light transmission with diffusion to obscure the light sources.

The mixing enclosure 58 is lined with a highly reflective material 59, such as MCPET® from Furakawa, to reduce losses from light reflected back into the mixing enclosure 58 by the lens. The highly reflective material 59 reflects between 98% and 99% of the light across the visible spectrum. A reflective material 60 is also provided on a copper metal core circuit board 61 and may be provided on any exposed portions of the upper housing 52. The reflective material 60 can also be MCPET®, laser cut to fit around the first light emitters 63 and the second light emitters 64.

The first light emitters 63 are phosphor light emitting diodes. The first light emitters 63 emit light which has x, y color coordinates which define a point which is within the first area on the 1931 CIE Chromaticity Diagram as described above. In this particular embodiment, 21 phosphor converted first light emitters 63 and 11 second light emitters 64 are utilized. The phosphor converted first light emitters 63 are Cree X Lamps from Cree, Inc., Durham, N.C. The second light emitters 64 are OSRAM Golden Dragon parts to which lenses are attached to improve light extraction. In particular, an optical adhesive is used to attach lenses, such as the lenses from Cree XRE parts, to the Golden Dragons. The brightnesses of the parts are sufficiently high to achieve the desired light output and wall plug efficiency.

The first light emitters 63 and the second light emitters 64 are serially connected in a single string. This provides a high voltage string that allows for increased efficiency in driving the first light emitters 63 and the second light emitters 64. The first light emitters 63 have color points that are close to a line between x,y coordinates of the 1931 CIE diagram of 0.3431, 0.3642; and 0.3625, 0.3979 and light emitting diodes having color points that are close to a line between x,y coordinates of the 1931 CIE diagram of 0.3638, 0.4010; and 0.3844, 0.4400. The phosphor converted light emitting diodes have outputs that are within the range of from 108.2 lumens to 112.6 lumens at 350 mA. The second light emitters have a dominant emission wavelength in the range of from about 590 nm to about 660 nm.

The first light emitters 63 and the second light emitters 64 are mounted on the circuit board 61 which is mounted with a thermal gasket material 62 to the upper housing 52. A conformal coating (not shown) of HumiSeal 1C49LV is applied to the circuit board 61. The circuit board 61 is connected to the power supply 65 through the upper housing 52.

Figure 7:
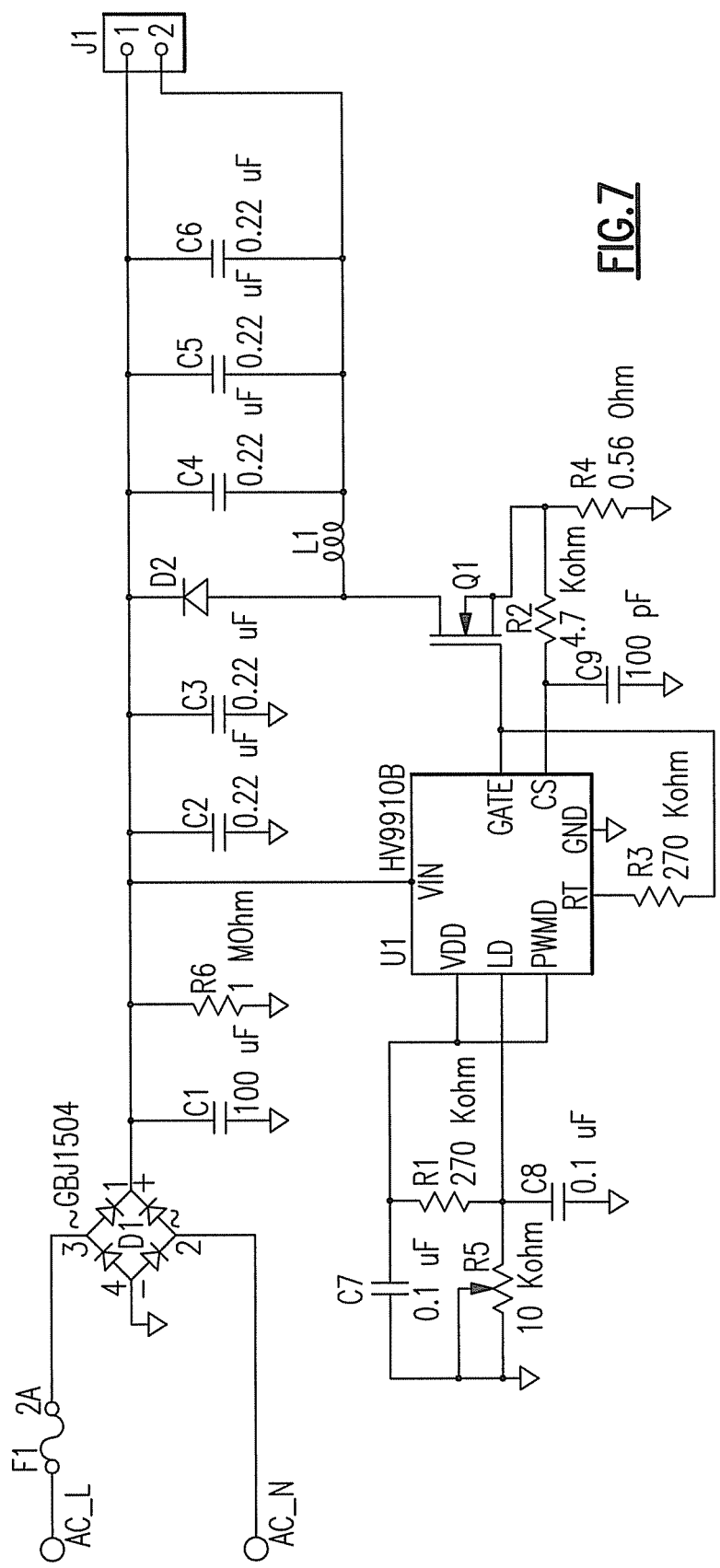
FIG. 7 is a schematic of the power supply 65 in the embodiment depicted in FIG. 6.

The power supply 65 is connected to the Edison connector 56 through wires 66 and 67. A schematic of the power supply 65 is provided in FIG. 7. In FIG. 7, the string of light sources 63 and light emitting diodes 64 is connected between pins 1 and 2 of J1. With regard to specific parts, the values in the present embodiment are provided in FIG. 7 for the majority of parts. With regard to parts without values, the diode D2 is a MURS140 from Digikey, the inductor L1 is 3.9 mH and the transistor Q1 is an nFET FQP3N30-ND from Digikey. The HV9910B is a universal high brightness LED driver from Supertex, Inc, Sunnyvale, Calif. The variable resistance R5 is provided to adjust the current through the string connected across J1.

Figure 8:
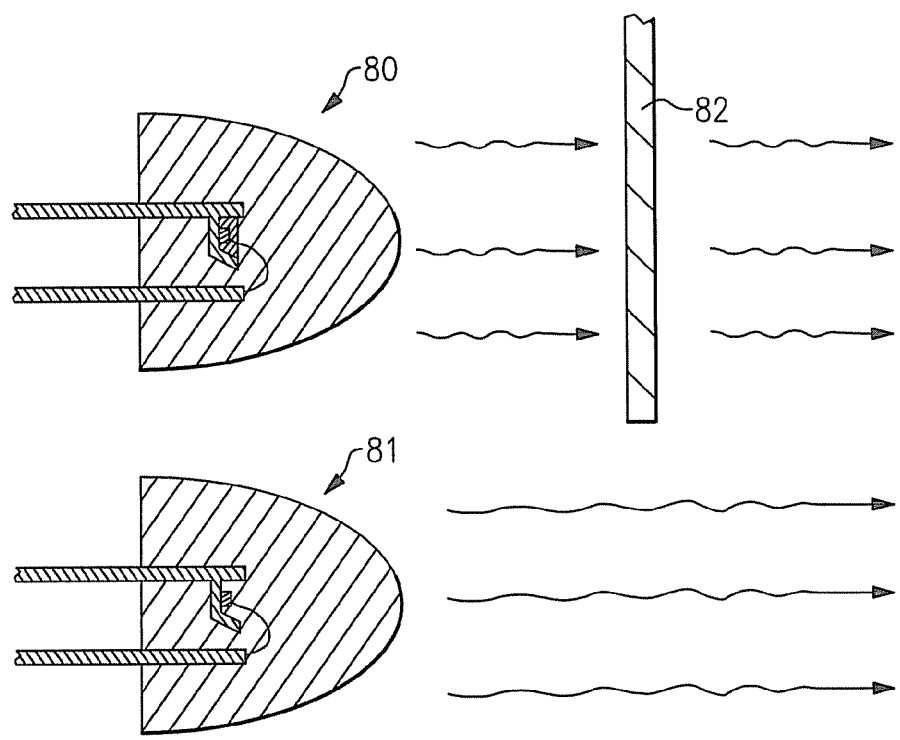
FIG. 8 depicts another representative embodiment of a lighting device according to the present inventive subject matter.

Another representative embodiment of a lighting device according to the present inventive subject matter is depicted in FIG. 8. Referring to FIG. 8, the lighting device comprises an LED lamp 80, an LED 81 and a filter 82. In this embodiment, the LED lamp 80 emits light having a color point within the first area on the 1931 CIE Chromaticity Diagram as defined above, and the LED 81 emits supplemental light. The light emitted from the LED lamp 80 passes through the filter 82 and modified light exits from the filter 82. The modified light mixes with the light from the LED 81.

Figure 9:
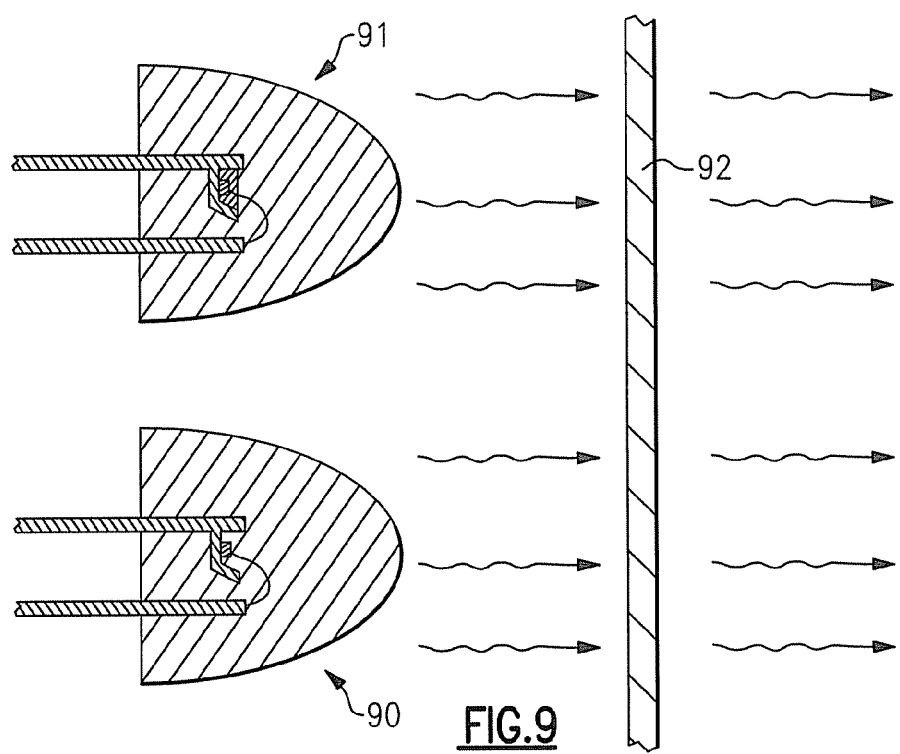
FIG. 9 depicts another representative embodiment of a lighting device according to the present inventive subject matter.

Another representative embodiment of a lighting device according to the present inventive subject matter is depicted in FIG. 9. Referring to FIG. 9, the lighting device comprises an LED 90, an LED lamp 91 and a filter 92. In this embodiment, the LED 90 emits supplemental light, the LED lamp 91 emits light having a color point within the first area on the 1931 CIE Chromaticity Diagram as defined above, the supplemental light and the light having a color point within the first area on the 1931 CIE Chromaticity Diagram as defined above mix to produce mixed light, and the mixed light passes through the filter 92, resulting in light having a color point within the third area defined above exiting the filter 92.

Figure 10:
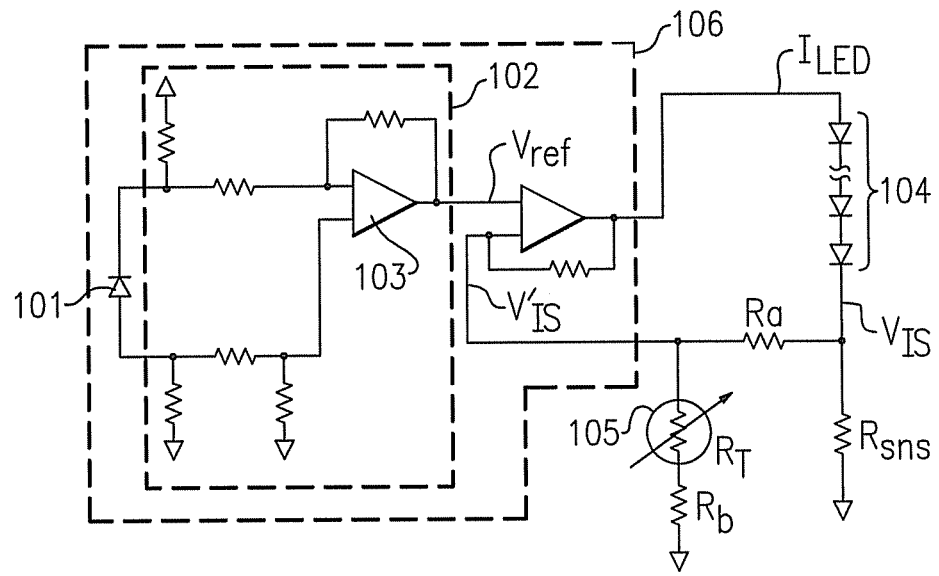
FIGS. 10 and 11 are diagrams of a circuit which can be employed in the methods and devices of the present inventive subject matter.

FIG. 10 is a diagram of a circuit which can be employed in the methods and devices of the present inventive subject matter. The circuit shown in FIG. 10 includes a sensor 101, a differential amplifier circuit 102 (which includes a comparator 103), a plurality of supplemental LEDs 104 and a thermistor 105. Features of this circuit include:

This circuit increases the supplemental LED current with increasing temperature by altering the LED sense signal as seen by the controlling element.

Figure 11:
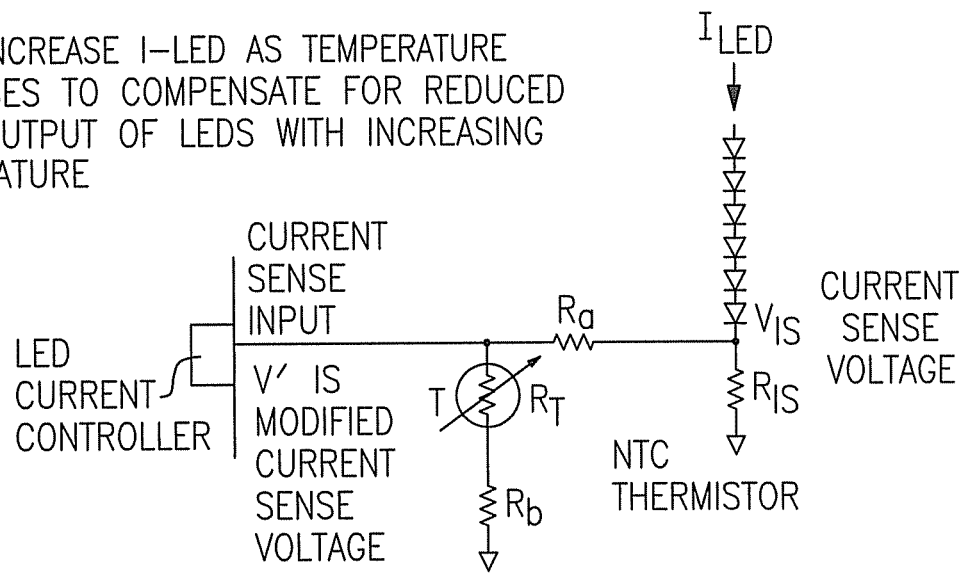

In normal operation, the controller 106 will maintain constant current by adjusting the LED current to maintain a constant voltage as seen at the current sense input (see FIG. 11). A) if $I_{LED}$ increases, $V'_{IS}$ increases, and the controller 106 will reduce current in response. B) If $I_{LED}$ decreases, $V'_{IS}$ decreases, and the controller 106 will increase current in response.

A voltage divider circuit consisting of $R_a$, $R_b$ and $R_T$ modifies the signal to the current sense input.

a) $V'_{IS} = V_{IS} \times (R_T + R_b)/(R_a + R_b + R_T)$ b) As the temperature at $R_T$ increases, voltage $V'_{IS}$ decreases, and the controller 106 will increase $I_{LED}$ in response.

c) As the temperature at $R_T$ decreases, voltage $V'_{IS}$ increases, and the controller 106 decreases $I_{LED}$ in response.

This circuit, and other circuitry that can be employed in accordance with the present inventive subject matter, is described in U.S. patent application Ser. No. 12/117,280, filed May 8, 2008 (now U.S. Patent Publication No. 2008/0309255), the entirety of which is hereby incorporated by reference as if set forth in its entirety.

Figure 12:
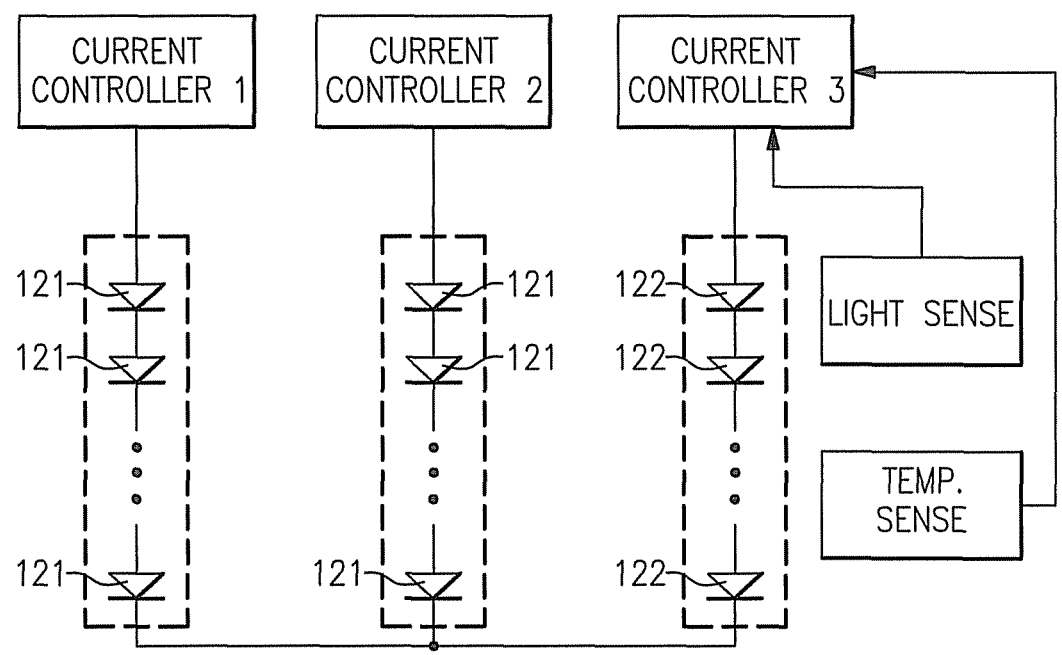
FIG. 12 is a schematic diagram of a circuit that includes controllers that are configured to control a ratio of non-white light of a first color point emitted by a plurality of first light emitters and saturated non-white light emitted by a plurality of second light emitters.

FIG. 12 is a schematic diagram of a circuit that includes controllers that are configured to control a ratio of non-white light of a first color point emitted by a plurality of first light emitters 121 and saturated non-white light emitted by a plurality of second light emitters 122 such that a combination of the non-white light of the first color point emitted by the first light emitters and the saturated non-white light emitted by the second light emitters is non-saturated, non-white light of a second color point.

Figure 13:
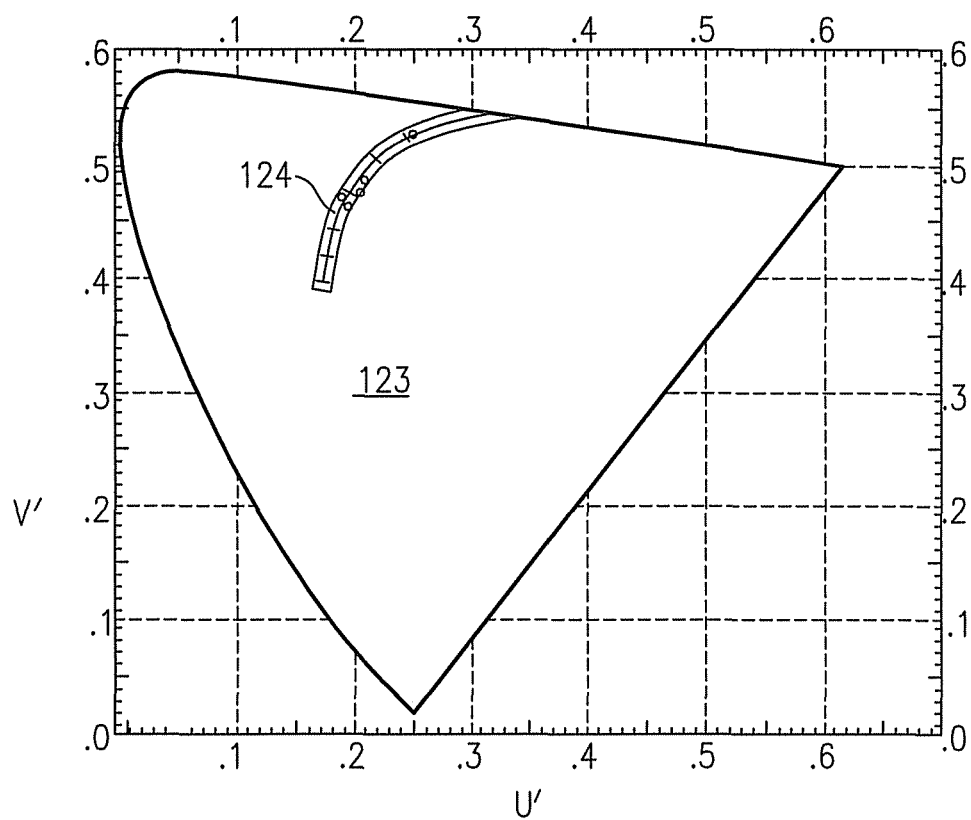
FIG. 13 is a 1976 CIE Chromaticity Diagram which has been marked to show the non-white region (i.e., everything outside the white region) as defined according to the present invention.
Figure 14:
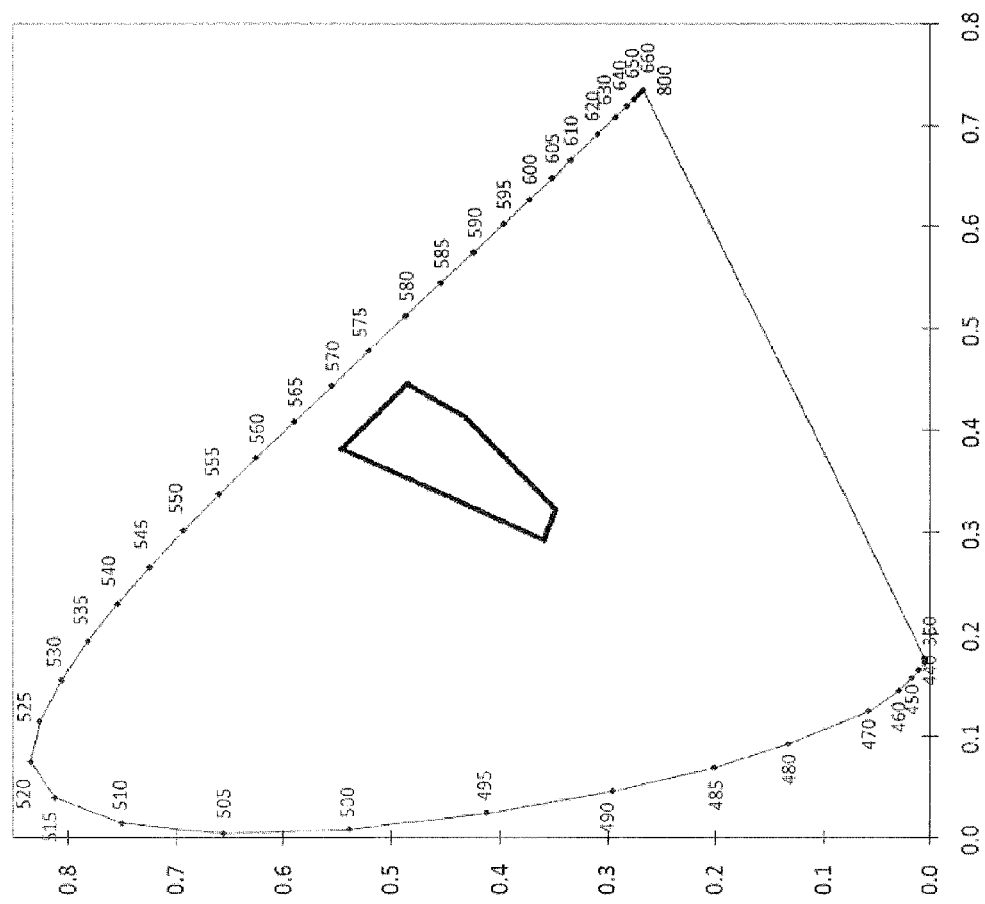
FIG. 14 is a plot of an area on a 1931 CIE Chromaticity Diagram.
Figure 15:
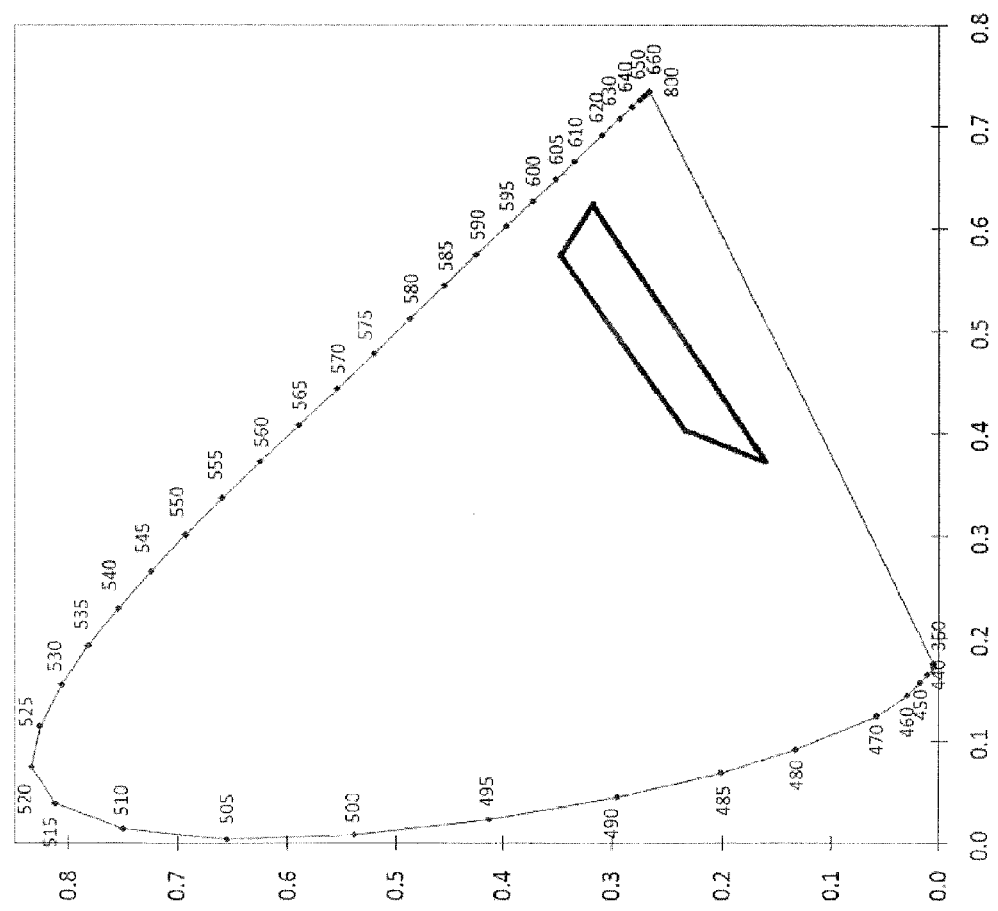
FIG. 15 is a plot of an area on a 1931 CIE Chromaticity Diagram.
Figure 16:
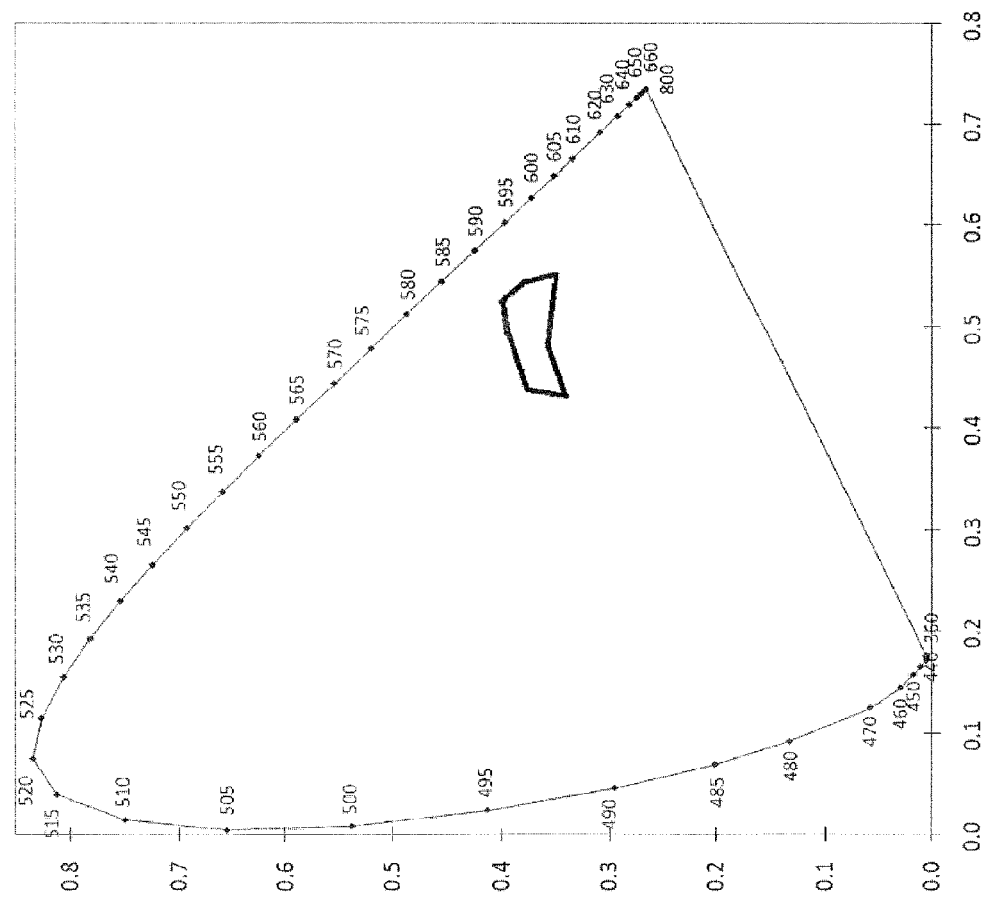
FIG. 16 is a plot of an area on a 1931 CIE Chromaticity Diagram.
Figure 17:
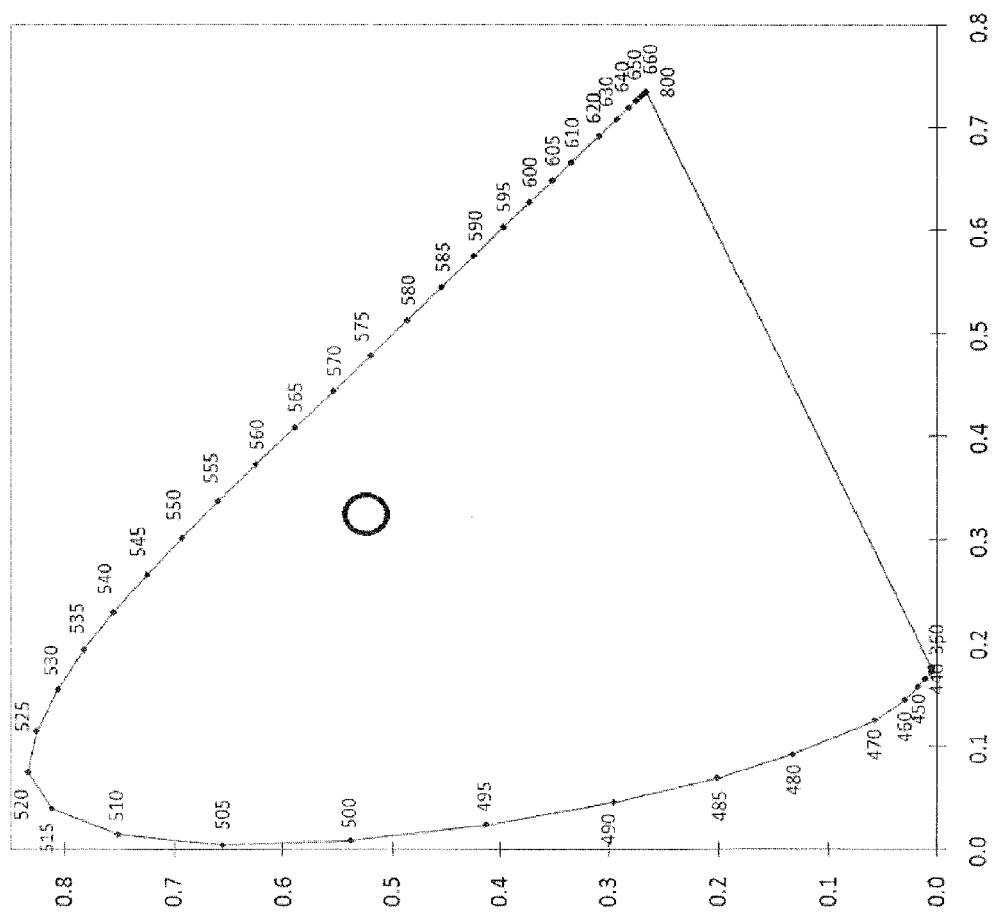
FIG. 17 is a plot of an area on a 1931 CIE Chromaticity Diagram.
Figure 18:
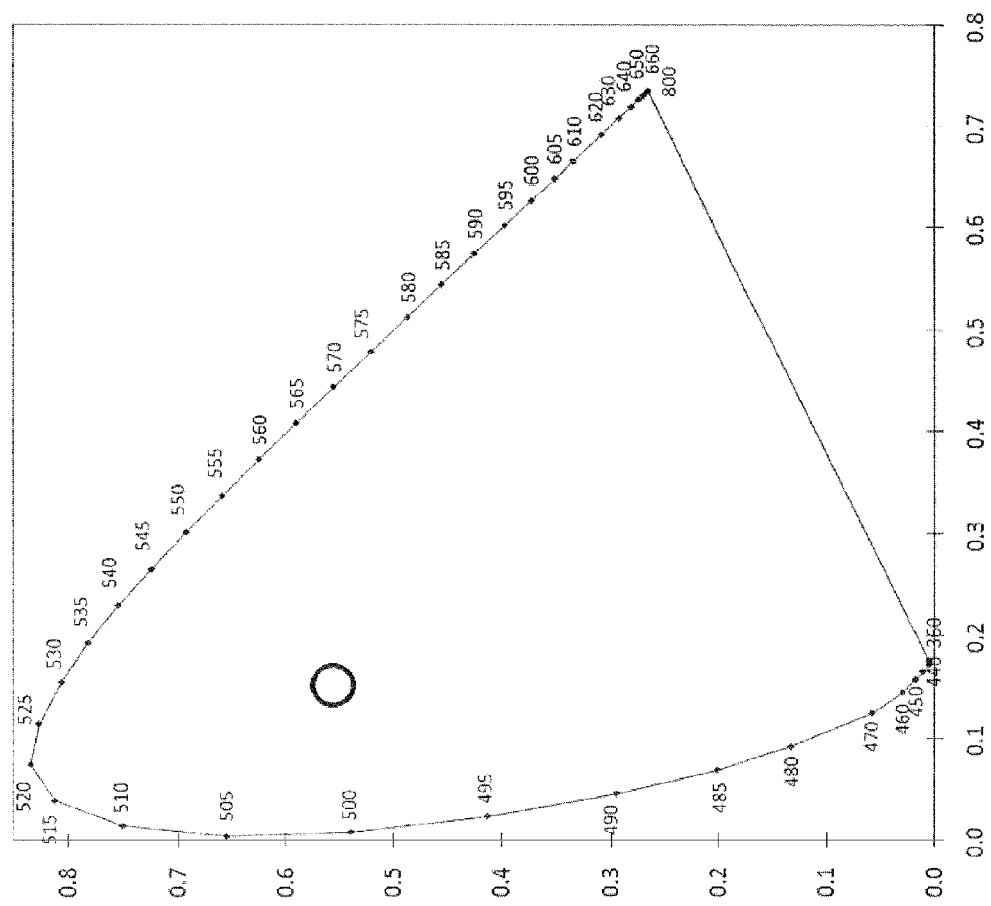
FIG. 18 is a plot of an area on a 1931 CIE Chromaticity Diagram.
Figure 19:
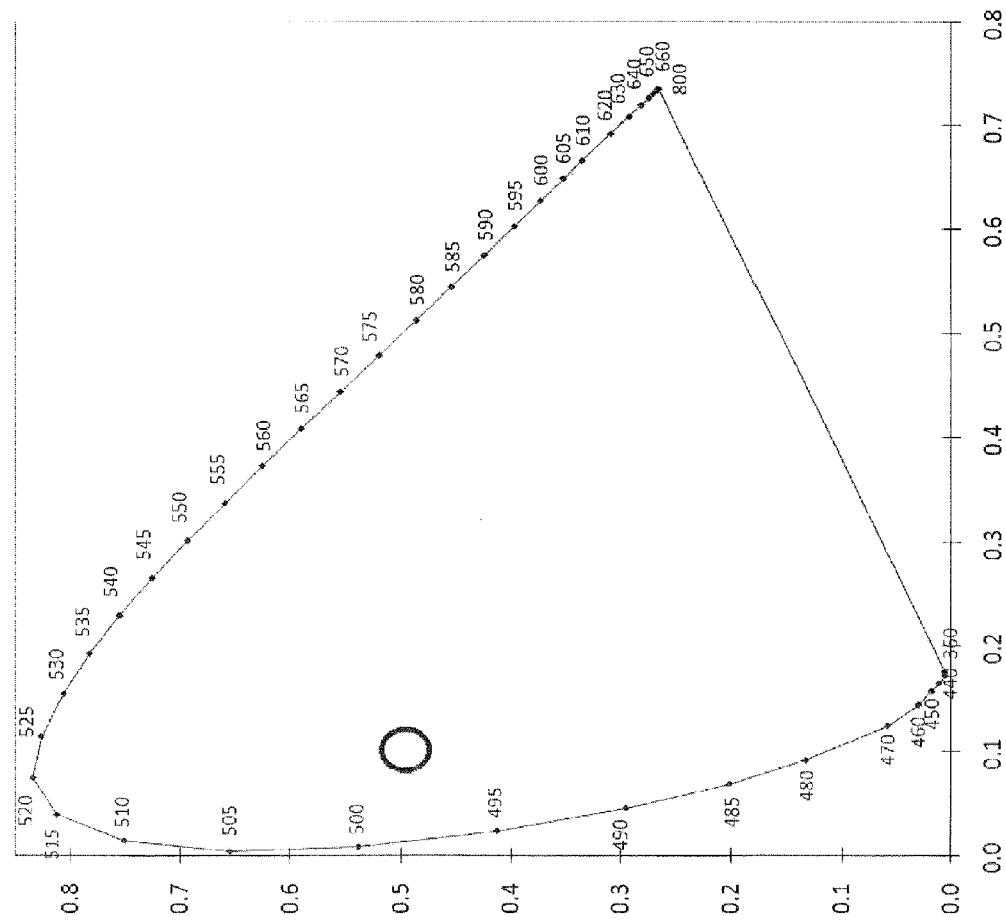
FIG. 19 is a plot of an area on a 1931 CIE Chromaticity Diagram.
Figure 20:
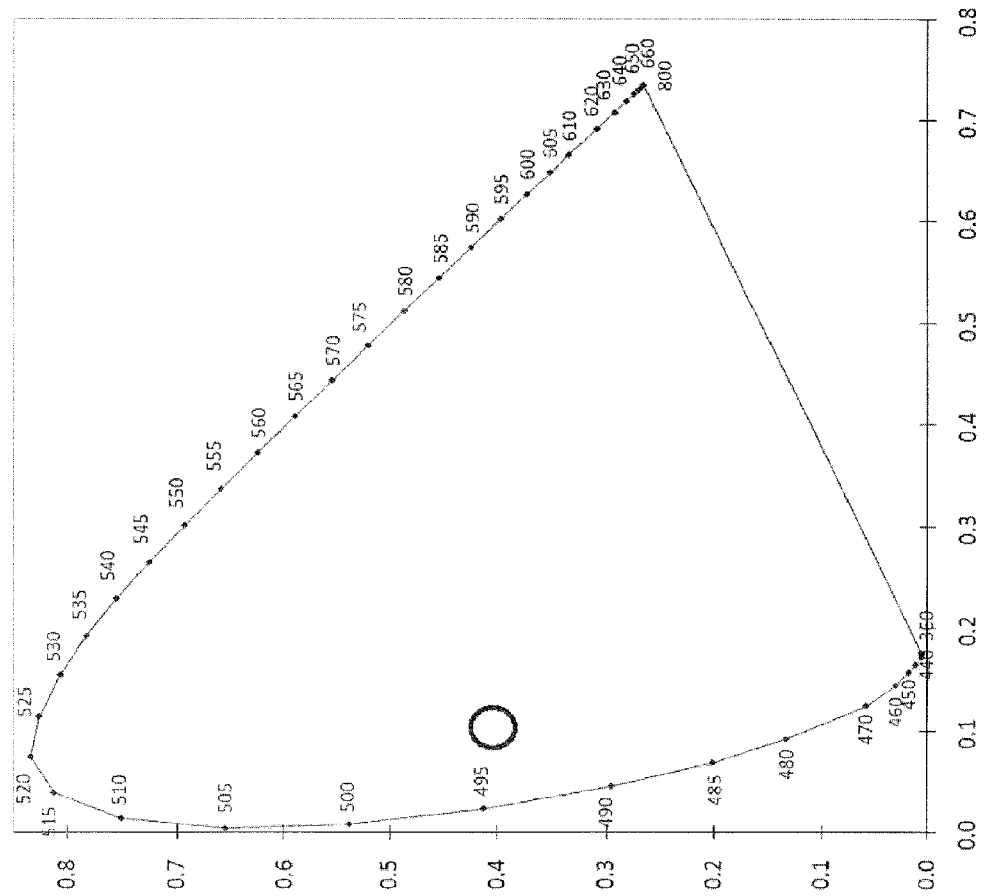
FIG. 20 is a plot of an area on a 1931 CIE Chromaticity Diagram.
Figure 21:
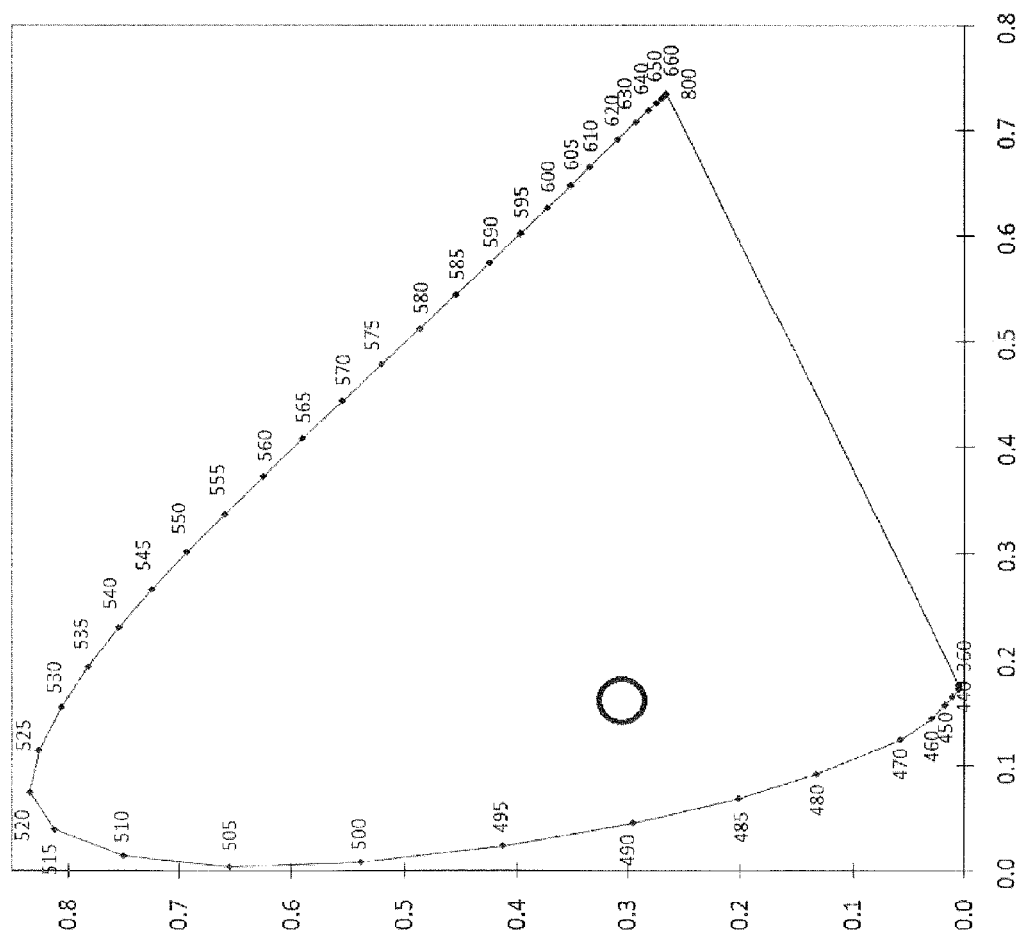
FIG. 21 is a plot of an area on a 1931 CIE Chromaticity Diagram.
Figure 22:
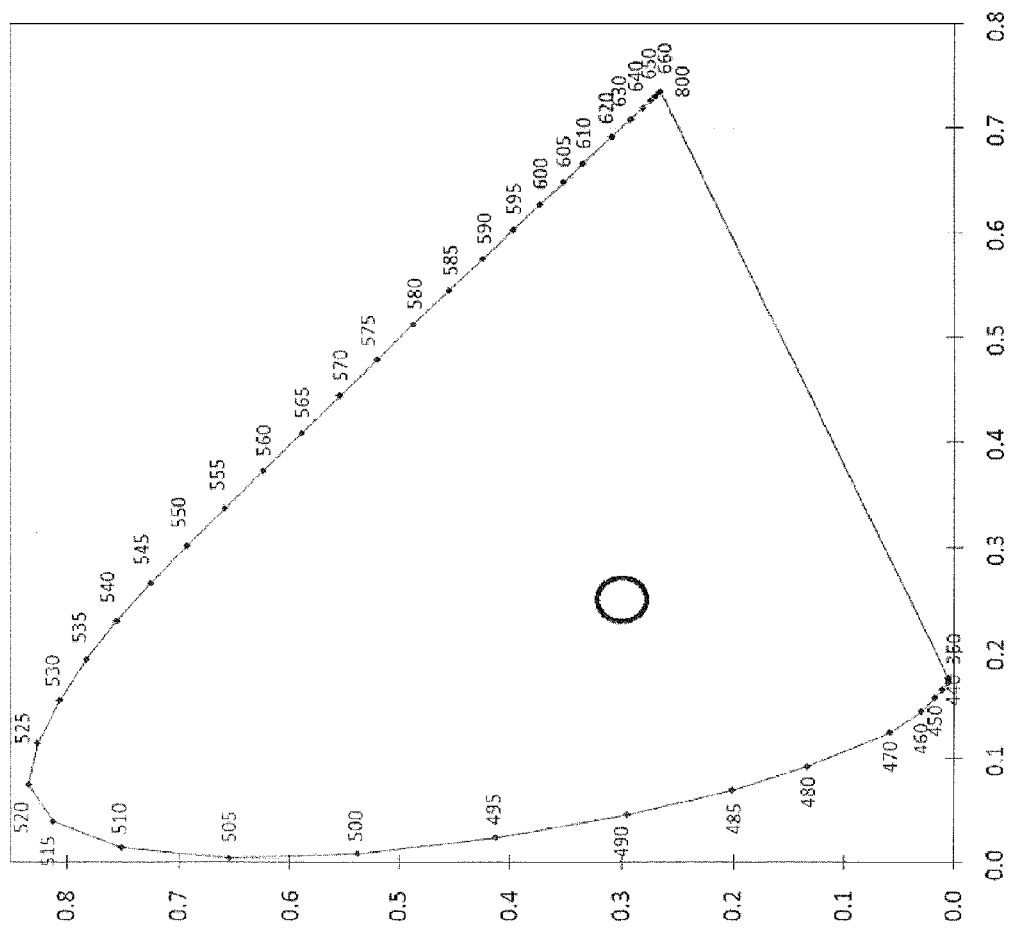
FIG. 22 is a plot of an area on a 1931 CIE Chromaticity Diagram.
Figure 23:
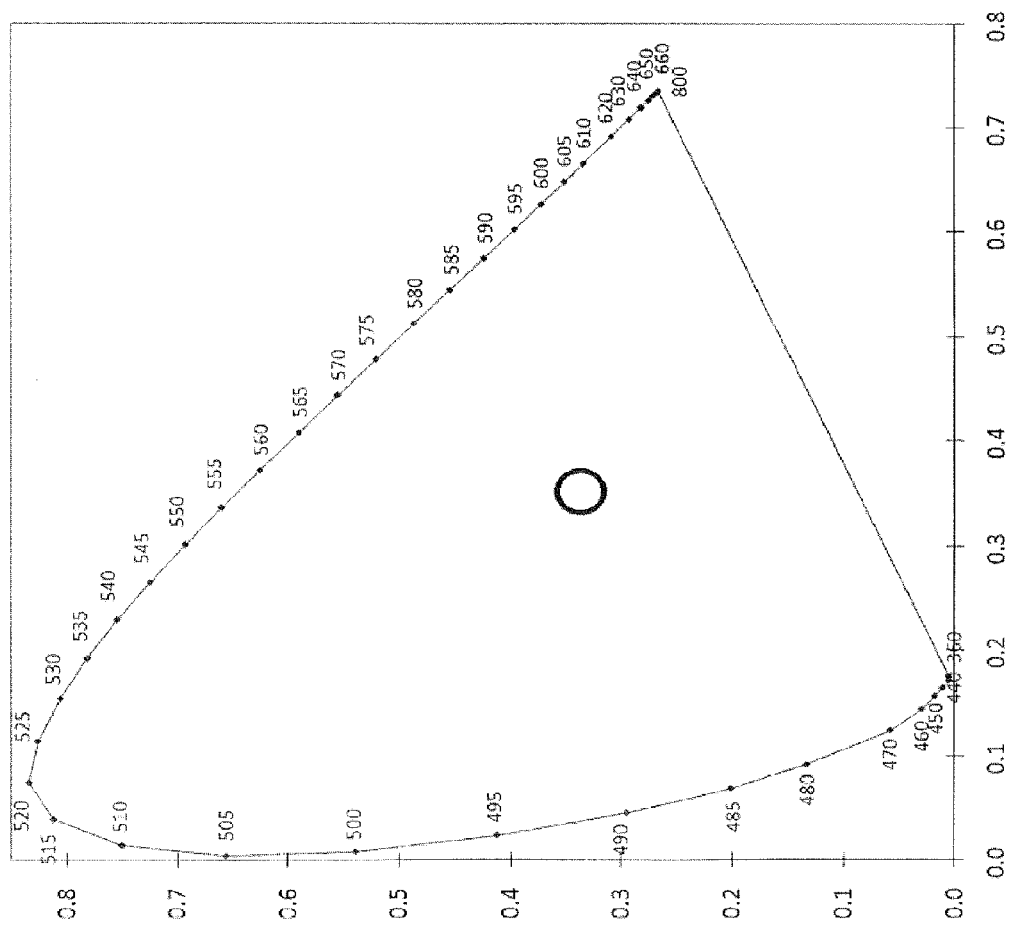
FIG. 23 is a plot of an area on a 1931 CIE Chromaticity Diagram.
Figure 24:
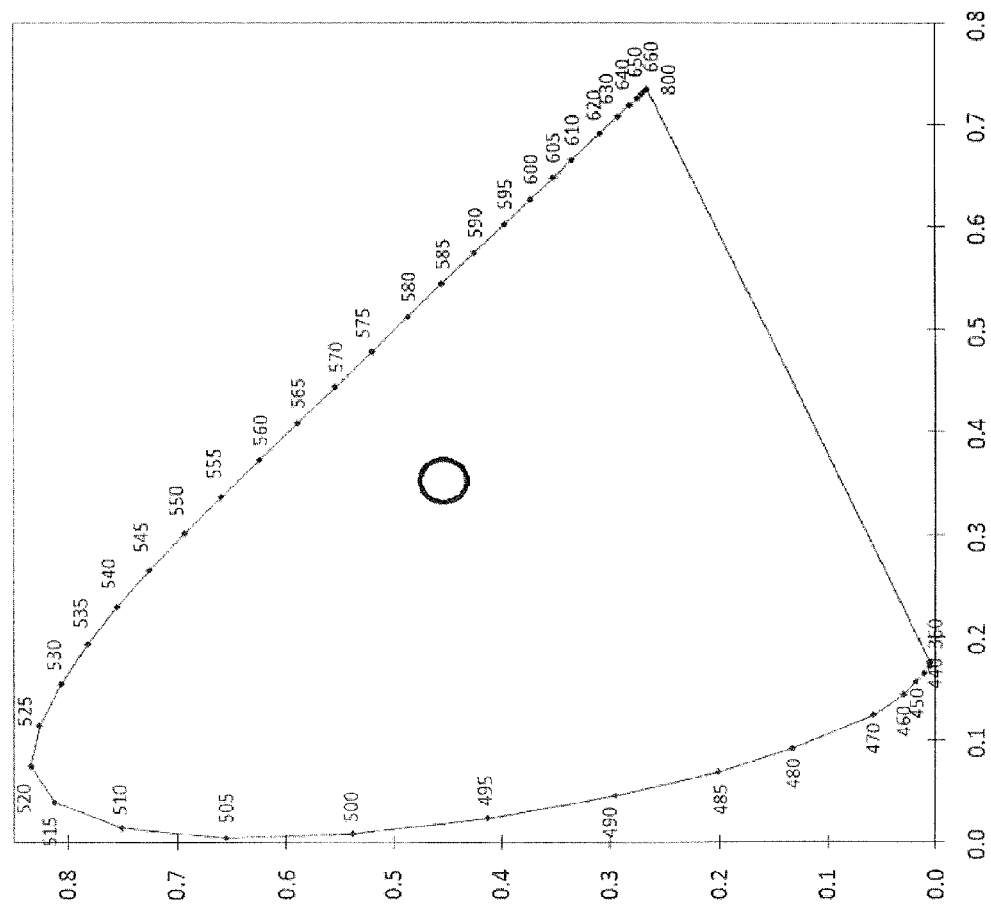
FIG. 24 is a plot of an area on a 1931 CIE Chromaticity Diagram.

FIG. 13 is a 1976 CIE Chromaticity Diagram which has been marked to show the non-white region 123 (i.e., everything outside the white region 124) as defined according to the present invention.

Examples

The examples described below are representative and illustrative, and do not in any way limit the scope of the present inventive subject matter. These examples have not been conducted, but would be expected to provide the results described.

Example 1

Non-saturated, non-white output light of a second color point having x, y coordinates of 0.520, 0.370 (corresponding to u', v' coordinates of 0.325, 0.520) and having a dominant wavelength of 597 nm, is obtained by mixing (1) light emitted by a first light emitter that emits non-saturated non-white light of a first color point having x, y coordinates of 0.3602, 0.4222 and having a dominant wavelength of 566 nm, and (2) light emitted by at least one second light emitter that emits saturated non-white light of a color point having x, y coordinates of 0.6964, 0.3035 and a dominant wavelength of 623. The light from the first light emitter constitutes 61 lumen percent of the non-saturated, non-white output light, and the light from the second light emitters) constitutes the remaining 39 lumen percent of the non-saturated, non-white output light. The output light has a CRI Ra of 72, and the lighting device achieves an LER of 283.

Example 2

Non-saturated, non-white output light of a second color point having x, y coordinates of 0.520, 0.370 (corresponding to u', v' coordinates of 0.325, 0.520) and having a dominant wavelength of 597 nm, is obtained by mixing (1) light emitted by a first light emitter that emits non-saturated non-white light of a first color point having x, y coordinates of 0.5777, 0.3209 and having a dominant wavelength of 617 nm, and (2) light emitted by at least one second light emitter that emits saturated non-white light of a color point having x, y coordinates of 0.1578, 0.7412 and a dominant wavelength of 527. The light from the first light emitter constitutes 75 lumen percent of the non-saturated, non-white output light, and the light from the second light emitters) constitutes the remaining 25 lumen percent of the non-saturated, non-white output light. The output light has a CRI Ra of 74, and the lighting device achieves an LER of 228.

Example 3

Non-saturated, non-white output light of a second color point having x, y coordinates of 0.330, 0.540 (corresponding to u', v' coordinates of 0.150, 0.551) and having a dominant wavelength of 554 nm, is obtained by mixing (1) light emitted by a first light emitter that emits non-saturated non-white light of a first color point having x, y coordinates of 0.3891, 0.4764 and having a dominant wavelength of 568 nm, and (2) light emitted by at least one second light emitter that emits saturated non-white light of a color point having x, y coordinates of 0.1578, 0.7412 and a dominant wavelength of 527. The light from the first light emitter constitutes 66 lumen percent of the non-saturated, non-white output light, and the light from the second light emitter(s) constitutes the remaining 34 lumen percent of the non-saturated, non-white output light. The output light has a CRI Ra of 53, and the lighting device achieves an LER of 442.

Example 4

Non-saturated, non-white output light of a second color point having x, y coordinates of 0.330, 0.540 (corresponding to u', v' coordinates of 0.150, 0.551) and having a dominant wavelength of 554 nm, is obtained by mixing (1) light emitted by a first light emitter that emits non-saturated non-white light of a first color point having x, y coordinates of 0.5450, 0.2985 and having a dominant wavelength of 673 nm, and (2) light emitted by at least one second light emitter that emits saturated non-white light of a color point having x, y coordinates of 0.1578, 0.7412 and a dominant wavelength of 527. The light from the first light emitter constitutes 25 lumen percent of the non-saturated, non-white output light, and the light from the second light emitter(s) constitutes the remaining 75 lumen percent of the non-saturated, non-white output light. The output light has a CRI Ra of 68, and the lighting device achieves an LER of 352.

Example 5

Non-saturated, non-white output light of a second color point having x, y coordinates of 0.200, 0.430 (corresponding to u', v' coordinates of 0.103, 0.499) and having a dominant wavelength of 502 nm, is obtained by mixing (1) light emitted by a first light emitter that emits non-saturated non-white light of a first color point having x, y coordinates of 0.3703, 0.4412 and having a dominant wavelength of 567 nm, and (2) light emitted by at least one second light emitter that emits saturated non-white light of a color point having x, y coordinates of 0.0699, 0.4239 and a dominant wavelength of 497. The light from the first light emitter constitutes 44 lumen percent of the non-saturated, non-white output light, and the light from the second light emitter(s) constitutes the remaining 56 lumen percent of the non-saturated, non-white output light. The output light has a CRI Ra of 27, and the lighting device achieves an LER of 287.

Example 6

Non-saturated, non-white output light of a second color point having x, y coordinates of 0.200, 0.430 (corresponding to u', v' coordinates of 0.103, 0.499) and having a dominant wavelength of 502 nm, is obtained by mixing (1) light emitted by a first light emitter that emits non-saturated non-white light of a first color point having x, y coordinates of 0.4449, 0.2300 and having a dominant wavelength of −505 nm, and (2) light emitted by at least one second light emitter that emits saturated non-white light of a color point having x, y coordinates of 0.0702, 0.5421 and a dominant wavelength of 503. The light from the first light emitter constitutes 18 lumen percent of the non-saturated, non-white output light, and the light from the second light emitter(s) constitutes the remaining 82 lumen percent of the non-saturated, non-white output light. The output light has a CRI Ra of 36, and the lighting device achieves an LER of 253.

Example 7

Non-saturated, non-white output light of a second color point having x, y coordinates of 0.150, 0.260 (corresponding to u', v' coordinates of 0.103, 0.402) and having a dominant wavelength of 487 nm, is obtained by mixing (1) light emitted by a first light emitter that emits non-saturated non-white light of a first color point having x, y coordinates of 0.3703, 0.4412 and having a dominant wavelength of 567 nm, and (2) light emitted by at least one second light emitter that emits saturated non-white light of a color point having x, y coordinates of 0.0879, 0.2175 and a dominant wavelength of 486. The light from the first light emitter constitutes 37 lumen percent of the non-saturated, non-white output light, and the light from the second light emitter(s) constitutes the remaining 63 lumen percent of the non-saturated, non-white output light. The lighting device achieves an LER of 190.

Example 8

Non-saturated, non-white output light of a second color point having x, y coordinates of 0.150, 0.260 (corresponding to u', v' coordinates of 0.103, 0.402) and having a dominant wavelength of 487 nm, is obtained by mixing (1) light emitted by a first light emitter that emits non-saturated non-white light of a first color point having x, y coordinates of 0.5642, 0.3117 and having a dominant wavelength of 626 nm, and (2) light emitted by at least one second light emitter that emits saturated non-white light of a color point having x, y coordinates of 0.0860, 0.2577 and a dominant wavelength of 488. The light from the first light emitter constitutes 16 lumen percent of the non-saturated, non-white output light, and the light from the second light emitter(s) constitutes the remaining 84 lumen percent of the non-saturated, non-white output light. The lighting device achieves an LER of 172.

Example 9

Non-saturated, non-white output light of a second color point having x, y coordinates of 0.170, 0.150 (corresponding to u', v' coordinates of 0.152, 0.303) and having a dominant wavelength of 475 nm, is obtained by mixing (1) light emitted by a first light emitter that emits non-saturated non-white light of a first color point having x, y coordinates of 0.3703, 0.4412 and having a dominant wavelength of 567 nm, and (2) light emitted by at least one second light emitter that emits saturated non-white light of a color point having x, y coordinates of 0.1233, 0.0844 and a dominant wavelength of 474. The light from the first light emitter constitutes 55 lumen percent of the non-saturated, non-white output light, and the light from the second light emitter(s) constitutes the remaining 45 lumen percent of the non-saturated, non-white output light. The lighting device achieves an LER of 148.

Example 10

Non-saturated, non-white output light of a second color point having x, y coordinates of 0.170, 0.150 (corresponding to u', v' coordinates of 0.152, 0.303) and having a dominant wavelength of 475 nm, is obtained by mixing (1) light emitted by a first light emitter that emits non-saturated non-white light of a first color point having x, y coordinates of 0.5041, 0.2705 and having a dominant wavelength of −497 nm, and (2) light emitted by at least one second light emitter that emits saturated non-white light of a color point having x, y coordinates of 0.1072, 0.1349 and a dominant wavelength of 480. The light from the first light emitter constitutes 28 lumen percent of the non-saturated, non-white output light, and the light from the second light emitter(s) constitutes the remaining 72 lumen percent of the non-saturated, non-white output light. The lighting device achieves an LER of 123.

Example 11

Non-saturated, non-white output light of a second color point having x, y coordinates of 0.260, 0.140 (corresponding to u', v' coordinates of 0.250, 0.303) and having a dominant wavelength of −568 nm (negative wavelength means that the wavelength value is a complementary color dominant, i.e., the wavelength cannot be specified with a standard dominant because the color point is on the red-purple boundary—in such situations, by convention, the color point is reflected through the point E, i.e., 0.333, 0.333 onto the border of the 1931 Chromaticity Diagram; that is, the color point that has a wavelength of −568 is identified as such because by drawing a ray that starts at the color point and passes through E, the ray will again intersect the border of the color diagram at 568 nm), is obtained by mixing (1) light emitted by a first light emitter that emits non-saturated non-white light of a first color point having x, y coordinates of 0.5041, 0.2705 and having a dominant wavelength of −497 nm, and (2) light emitted by at least one second light emitter that emits saturated non-white light of a color point having x, y coordinates of 0.1291, 0.0698 and a dominant wavelength of 471. The light from the first light emitter constitutes 67 lumen percent of the non-saturated, non-white output light, and the light from the second light emitter(s) constitutes the remaining 33 lumen percent of the non-saturated, non-white output light. The lighting device achieves an LER of 124.

Example 12

Non-saturated, non-white output light of a second color point having x, y coordinates of 0.370, 0.160 (corresponding to u', v' coordinates of 0.354, 0.344) and having a dominant wavelength of −543 nm, is obtained by mixing (1) light emitted by a first light emitter that emits non-saturated non-white light of a first color point having x, y coordinates of 0.5918, 0.3305 and having a dominant wavelength of 612 nm, and (2) light emitted by at least one second light emitter that emits saturated non-white light of a color point having x, y coordinates of 0.1702, 0.0065 and a dominant wavelength of 427. The light from the first light emitter constitutes 98 lumen percent of the non-saturated, non-white output light, and the light from the second light emitter(s) constitutes the remaining 2 lumen percent of the non-saturated, non-white output light. The output light has a CRI Ra of 39, and the lighting device achieves an LER of 31.

Example 13

Non-saturated, non-white output light of a second color point having x, y coordinates of 0.460, 0.260 (corresponding to u', v' coordinates of 0.354, 0.450) and having a dominant wavelength of −500 nm, is obtained by mixing (1) light emitted by a first light emitter that emits non-saturated non-white light of a first color point having x, y coordinates of 0.5041, 0.2705 and having a dominant wavelength of −497 nm, and (2) light emitted by at least one second light emitter that emits saturated non-white light of a color point having x, y coordinates of 0.0964, 0.1775 and a dominant wavelength of 483. The light from the first light emitter constitutes 93 lumen percent of the non-saturated, non-white output light, and the light from the second light emitter(s) constitutes the remaining 7 lumen percent of the non-saturated, non-white output light. The output light has a CRI Ra of 33, and the lighting device achieves an LER of 176.

Any two or more structural parts of the lighting devices described herein can be integrated. Any structural part of the lighting devices described herein can be provided in two or more parts which are held together, if necessary. Similarly, any two or more functions can be conducted simultaneously, and/or any function can be conducted in a series of steps.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

The invention claimed is:

1. A solid state lighting device comprising:
   at least one first light emitter that emits non-saturated non-white light of a first color point;
   at least one second light emitter that emits saturated non-white light; and
   a controller configured to control a ratio of the non-white light of the first color point emitted by the at least one first light emitter and the saturated non-white light emitted by the at least one second light emitter such that a combination of the non-white light of the first color point emitted by the at least one first light emitter and the saturated non-white light emitted by the at least one second light emitter is non-saturated, non-white light of a second color point, the first color point within one of a first area on a 1931 CIE Chromaticity Diagram and a second area on a 1931 CIE Chromaticity Diagram,
   the first area enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point and the fifth line segment connecting the fifth point to the first point, the first point having x, y coordinates of 0.29, 0.36, the second point having x, y coordinates of 0.32, 0.35, the third point having x, y coordinates of 0.41, 0.43, the fourth point having x, y coordinates of 0.44, 0.49, and the fifth point having x, y coordinates of 0.38, 0.53,
   the second area enclosed by sixth, seventh, eighth and ninth line segments, the sixth line segment connecting a sixth point to a seventh point, the seventh line segment connecting the seventh point to an eighth point, the eighth line segment connecting the eighth point to a ninth point, and the ninth line segment connecting the ninth point to the sixth point, the sixth point having x, y coordinates of 0.57, 0.35, the seventh point having x, y coordinates of 0.62, 0.32, the eighth point having x, y coordinates of 0.37, 0.16, and the ninth point having x, y coordinates of 0.40, 0.23.

2. The solid state lighting device of claim 1, wherein the first light emitter comprises a first solid state light emitter that emits light of a first peak emission wavelength and a light conversion material that is excited by light of the first peak emission wavelength to emit broad spectrum light; and
   wherein the second light emitter comprises a second solid state light emitter that emits light of a second peak emission wavelength, different from the first peak emission wavelength.

3. The solid state lighting device of claim 1, wherein the first color point is within one of the first area and the second area with the solid state lighting device at thermal equilibrium.

4. The solid state lighting device of claim 1, wherein the first color point is within one of the first area and the second area with the solid state lighting device at ambient temperature.

5. The solid state lighting device of claim 3, 1, wherein the second color point is below the blackbody locus on the 1931 CIE Chromaticity Diagram.

6. The solid state lighting device of claim 1, wherein the second color point is below the blackbody locus on the 1931 CIE Chromaticity Diagram with the solid state lighting device at thermal equilibrium.

7. The solid state lighting device of claim 1, wherein the second color point is below the blackbody locus on the 1931 CIE Chromaticity Diagram with the solid state lighting device at ambient temperature.

8. The solid state lighting device of claim 1, wherein the second color point is within a third area on a 1931 CIE Chromaticity Diagram enclosed by tenth, eleventh, twelfth, thirteenth, fourteenth, fifteenth and sixteenth line segments, the tenth line segment connecting a tenth point to a eleventh point, the eleventh line segment connecting the eleventh point to a twelfth point, the twelfth line segment connecting the twelfth point to a thirteenth point, the thirteenth line segment connecting the thirteenth point to a fourteenth point, the fourteenth line segment connecting the fourteenth point to a fifteenth point, the fifteenth line segment connecting the fifteenth point to a sixteenth point, the sixteenth line segment connecting the sixteenth point to the tenth point, the tenth point having x, y coordinates of 0.490, 0.395, the eleventh point having x, y coordinates of 0.530, 0.400, the twelfth point having x, y coordinates of 0.540, 0.380, the thirteenth point having x, y coordinates of 0.545, 0.345, the fourteenth point having x, y coordinates of 0.480, 0.350, the fifteenth point having x, y coordinates of 0.420, 0.345, and the sixteenth point having x, y coordinates of 0.435, 0.375.

9. The solid state lighting device of claim 8, wherein the first color point is within the first area on a 1931 CIF Chromaticity Diagram and the at least one second light emitter that emits saturated non-white light emits light having a peak emission wavelength in the range of from about 600 nm to about 660 nm.

10. The solid state lighting device of claim 8, wherein the first color point is within the second area on a 1931 CIE Chromaticity Diagram and the at least one second light emitter that emits saturated non-white light emits light having a peak emission wavelength in the range of from about 495 nm to about 575 nm.

11. The solid state lighting device of claim 8, wherein the combination of the non-white light of the first color point emitted by the at least one first light emitter and the saturated non-white light emitted by the at least one second light emitter has a CRI Ra at least 50.

12. The solid state lighting device of claim 1, wherein the second color point is within one of a fourth area on a 1976 CIE Chromaticity Diagram, a fifth area on a 1976 CIE Chromaticity Diagram, a sixth area on a 1976 CIE Chromaticity Diagram, a seventh area on a 1976 CIE Chromaticity Diagram, an eighth area on a 1976 CIE Chromaticity Diagram, a ninth area on a 1976 CIE Chromaticity Diagram, a tenth area on a 1976 CIE Chromaticity Diagram, and an eleventh area on a 1976 CIE Chromaticity Diagram,
the fourth area comprising a fourth color point having u', v' coordinates of 0.325, 0.520, and all color points that are spaced therefrom by a unit distance of not more than 0.02 on the 1976 CIE Chromaticity Diagram,
the fifth area comprising a fifth color point having u', v' coordinates of 0.150, 0.551, and all color points that are spaced therefrom by a unit distance of not more than 0.02 on the 1976 CIE Chromaticity Diagram,
the sixth area comprising a sixth color point having u', v' coordinates of 0.103, 0.499, and all color points that are spaced therefrom by a unit distance of not more than 0.02 on the 1976 CIE Chromaticity Diagram,
the seventh area comprising a seventh color point having u', v' coordinates of 0.103, 0.402, and all color points that are spaced therefrom by a unit distance of not more than 0.02 on the 1976 CIE Chromaticity Diagram,
the eighth area comprising an eighth color point having u', v' coordinates of 0.152, 0.303, and all color points that are spaced therefrom by a unit distance of not more than 0.02 on the 1976 CIE Chromaticity Diagram,
the ninth area comprising a ninth color point having u', v' coordinates of 0.250, 0.303, and all color points that are spaced therefrom by a unit distance of not more than 0.02 on the 1976 CIE Chromaticity Diagram,
the tenth area comprising a tenth color point having u', v' coordinates of 0.354, 0.344, and all color points that are spaced therefrom by a unit distance of not more than 0.02 on the 1976 CIE Chromaticity Diagram, and
the eleventh area comprising an eleventh color point having u', v' coordinates of 0.354, 0.450, and all color points that are spaced therefrom by a unit distance of not more than 0.02 on the 1976 CIE Chromaticity Diagram.

13. The solid state lighting device of claim 1, wherein the second color point is above the blackbody locus on the 1931 CIE Chromaticity Diagram.

14. The solid state lighting device of claim 13, wherein the second color point is above the blackbody locus on the 1931 CIE Chromaticity Diagram with the solid state lighting device at thermal equilibrium.

15. The solid state lighting device of claim 13, wherein the second color point is above the blackbody locus on the 1931 CIE Chromaticity Diagram with the solid state lighting device at ambient temperature.

16. The solid state lighting device of claim 13, wherein the saturated non-white light emitted by the at least one second light emitter is of a third color point that is above the blackbody locus of the 1931 CIE Chromaticity Diagram.

17. A solid state lighting device comprising:
at least one first light emitter that emits light which, in an absence of any additional light, has x, y color coordinates which define a first color point which is within one of a first area on a 1931 CIE Chromaticity Diagram and a second area on a 1931 CIE Chromaticity Diagram; and
at least one second light emitter, the at least one second light emitter comprising a second solid state light emitter,
the first area being enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.29, 0.36, the second point having x, y coordinates of 0.32, 0.35, the third point having x, y coordinates of 0.41, 0.43, the fourth point having x, y coordinates of 0.44, 0.49, and the fifth point having x, y coordinates of 0.38, 0.53,
the second area being enclosed by sixth, seventh, eighth and ninth line segments, the sixth line segment connecting a sixth point to a seventh point, the seventh line segment connecting the seventh point to an eighth point, the eighth line segment connecting the eighth point to a ninth point, and the ninth line segment connecting the ninth point to the sixth point, the sixth point having x, y coordinates of 0.57, 0.35, the seventh point having x, y coordinates of 0.62, 0.32, the eighth point having x, y coordinates of 0.37, 0.16, and the ninth point having x, y coordinates of 0.40, 0.23,
wherein:
when the at least one first light emitter and the at least one second light emitter are illuminated, output light from the lighting device is non-white and has a second color point.

18. The solid state lighting device of claim 17, wherein the second color point is below the blackbody locus on the 1931 CIE Chromaticity Diagram.

19. The solid state lighting device of claim 17, wherein the second color point is below the blackbody locus on the 1931 CIE Chromaticity Diagram with the solid state lighting device at thermal equilibrium.

20. The solid state lighting device of claim 17, wherein the second color point is below the blackbody locus on the 1931 CIE Chromaticity Diagram with the solid state lighting device at ambient temperature.

21. The solid state lighting device of claim 17, wherein the second color point is within a third area on a 1931 CIE Chromaticity Diagram enclosed by tenth, eleventh, twelfth, thirteenth, fourteenth, fifteenth and sixteenth line segments, the tenth line segment connecting a tenth point to a eleventh point, the eleventh line segment connecting the eleventh point to a twelfth point, the twelfth line segment connecting the twelfth point to a thirteenth point, the thirteenth line segment connecting the thirteenth point to a fourteenth point, the fourteenth line segment connecting the fourteenth point to a fifteenth point, the fifteenth line segment connecting the fifteenth point to a sixteenth point, the sixteenth line segment connecting the sixteenth point to the tenth point, the tenth point having x, y coordinates of 0.490, 0.395, the eleventh point having x, y coordinates of 0.530, 0.400, the twelfth point having x, y coordinates of 0.540, 0.380, the thirteenth point having x, y coordinates of 0.545, 0.345, the fourteenth point having x, y coordinates of 0.480, 0.350, the fifteenth point having x, y coordinates of 0.420, 0.345, and the sixteenth point having x, y coordinates of 0.435, 0.375.

22. The solid state lighting device of claim 17, wherein the second color point is above the blackbody locus on the 1931 CIE Chromaticity Diagram.

23. The solid state lighting device of claim 17, wherein the second color point is above the blackbody locus on the 1931 CIE Chromaticity Diagram with the solid state lighting device at thermal equilibrium.

24. The solid state lighting device of claim 17, wherein the second color point is above the blackbody locus on the 1931 CIE Chromaticity Diagram with the solid state lighting device at ambient temperature.

25. The solid state lighting device of claim 24, wherein the second light emitter emits light of a third color point that is above the blackbody locus of the 1931 CIE Chromaticity Diagram.

26. A method comprising:
   illuminating at least one first light emitter to emit light which, in an absence of any additional light, has x, y color coordinates which define a point which is within one of a first area on a 1931 CIE Chromaticity Diagram and a second area on a 1931 CIE Chromaticity Diagram; and
   illuminating at least one second light emitter, the at least one second light emitter comprising a second solid state light emitter,
   to provide output light from the lighting device, the output light having a non-white color point,
   the first area being enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.29, 0.36, the second point having x, y coordinates of 0.32, 0.35, the third point having x, y coordinates of 0.41, 0.43, the fourth point having x, y coordinates of 0.44, 0.49, and the fifth point having x, y coordinates of 0.38, 0.53,
   the second area being enclosed by sixth, seventh, eighth and ninth line segments, the sixth line segment connecting a sixth point to a seventh point, the seventh line segment connecting the seventh point to an eighth point, the eighth line segment connecting the eighth point to a ninth point, and the ninth line segment connecting the ninth point to the sixth point, the sixth point having x, y coordinates of 0.57, 0.35, the seventh point having x, y coordinates of 0.62, 0.32, the eighth point having x, y coordinates of 0.37, 0.16, and the ninth point having x, y coordinates of 0.40, 0.23.

27. A method as recited in claim 26, wherein the method further comprises:
   controlling a ratio of the non-white light of the first color point emitted by the at least one first light emitter and the saturated non-white light emitted by the at least one second light emitter such that a combination of the non-white light of the first color point emitted by the at least one first light emitter and the saturated non-white light emitted by the at least one second light emitter is non-saturated, non-white light of a second color point.

28. The solid state lighting device of claim 27, wherein the combination of the non-white light of the first color point emitted by the at least one first light emitter and the saturated non-white light emitted by the at least one second light emitter has a CRI of at least 50 and the combination of the non-white light of the first color point emitted by the at least one first light emitter and the saturated non-white light emitted by the at least one second light emitter is emitted at a wall plug efficiency of at least 10 lumens per watt.

29. The method of claim 26, wherein the output light has a CRI of at least 50 and the output light is emitted at a wall plug efficiency of at least 10 lumens per watt.

* * * * *

UNITED STATES PATENT AND TRADEMARK OFFICE
CERTIFICATE OF CORRECTION

PATENT NO.       : 8,648,546 B2                                              Page 1 of 1
APPLICATION NO.  : 12/541215
DATED            : February 11, 2014
INVENTOR(S)      : Antony Paul Van De Ven and Gerald H. Negley It is certified that error appears in the above-identified patent and that said Letters Patent is hereby corrected as shown below:

In the Claims:

Column 39, line 58

Please change: "point and" to -- point, and --

Column 40, line 26

Please change: "claim 3, 1," to -- claim 1, --

Column 40, line 58

Please change: "CIF" to -- CIE --

Signed and Sealed this
Twenty-seventh Day of May, 2014

Michelle K. Lee
*Deputy Director of the United States Patent and Trademark Office*